(12) United States Patent
Park et al.

(10) Patent No.: US 11,251,307 B2
(45) Date of Patent: Feb. 15, 2022

(54) DEVICE COMPRISING 2D MATERIAL

(71) Applicant: Samsung Electronics Co., Ltd., Suwon-si (KR)

(72) Inventors: Tae-jin Park, Yongin-si (KR); Jin-bum Kim, Seoul (KR); Bong-soo Kim, Yongin-si (KR); Kyu-pil Lee, Seongnam-si (KR); Hyeong-sun Hong, Seongnam-si (KR); Yoo-sang Hwang, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 6 days.

(21) Appl. No.: 16/120,705

(22) Filed: Sep. 4, 2018

(65) Prior Publication Data

US 2019/0074380 A1 Mar. 7, 2019

(30) Foreign Application Priority Data

Sep. 4, 2017 (KR) .................. 10-2017-0112493

(51) Int. Cl.
*H01L 29/786* (2006.01)
*H01L 29/778* (2006.01)
(Continued)

(52) U.S. Cl.
CPC .. *H01L 29/78603* (2013.01); *H01L 21/02612* (2013.01); *H01L 29/0665* (2013.01); *H01L 29/1606* (2013.01); *H01L 29/4236* (2013.01); *H01L 29/42384* (2013.01); *H01L 29/66969* (2013.01); *H01L 29/66977* (2013.01); *H01L 29/778* (2013.01); *H01L 29/7788* (2013.01);
(Continued)

(58) Field of Classification Search
CPC .... H01L 29/24; H01L 29/778; H01L 29/1606
See application file for complete search history.

(56) References Cited

U.S. PATENT DOCUMENTS 9,472,401 B2 10/2016 Chiappe
9,576,950 B1 2/2017 Yeo et al.
(Continued)

FOREIGN PATENT DOCUMENTS

KR 10-2012-0051409 A 5/2012
KR 10-2016-0043455 A 4/2016

OTHER PUBLICATIONS

Office Action dated Aug. 17, 2020, issued in co-pending U.S. Appl. No. 16/120,726.
Office Action dated Feb. 14, 2020, issued in co-pending U.S. Appl. No. 16/120,726.

*Primary Examiner* — Marcos D. Pizarro
*Assistant Examiner* — Quinton A Brasfield
(74) *Attorney, Agent, or Firm* — Harness, Dickey & Pierce, P.L.C.

(57) ABSTRACT

A device includes a substrate, a first electrode on the substrate, an insulating pattern on the substrate, a second electrode on an upper end of the insulating pattern, a two-dimensional (2D) material layer on a side surface of the insulating pattern, a gate insulating layer covering the 2D material layer, and a gate electrode contacting the gate insulting layer. The insulating pattern extends from the first electrode in a direction substantially vertical to the substrate. The 2D material layer includes at least one atomic layer of a 2D material that is substantially parallel to the side surface of the insulating pattern.

20 Claims, 30 Drawing Sheets

(51) Int. Cl.
  *H01L 29/88*   (2006.01)
  *H01L 21/02*   (2006.01)
  *H01L 29/06*   (2006.01)
  *H01L 29/16*   (2006.01)
  *H01L 29/423*  (2006.01)
  *H01L 29/66*   (2006.01)
  *H01L 29/78*   (2006.01)
  *H01L 29/86*   (2006.01)
  *H01L 29/24*   (2006.01)

(52) U.S. Cl.
  CPC ...... *H01L 29/7789* (2013.01); *H01L 29/7853* (2013.01); *H01L 29/78606* (2013.01); *H01L 29/78642* (2013.01); *H01L 29/78696* (2013.01); *H01L 29/86* (2013.01); *H01L 29/88* (2013.01); *H01L 21/02488* (2013.01); *H01L 21/02494* (2013.01); *H01L 21/02568* (2013.01); *H01L 21/02614* (2013.01); *H01L 29/24* (2013.01); *H01L 29/66045* (2013.01)

(56) References Cited

U.S. PATENT DOCUMENTS

| | | | |
|---|---|---|---|
| 9,620,665 | B1 | 4/2017 | Bartolucci et al. |
| 9,658,186 | B2 | 5/2017 | Yang et al. |
| 9,673,390 | B2 | 6/2017 | Reed et al. |
| 9,947,660 | B1 | 4/2018 | Rosenblatt et al. |
| 2012/0119289 | A1 | 5/2012 | Kim |
| 2016/0093491 | A1 | 3/2016 | Choi et al. |
| 2016/0093745 | A1* | 3/2016 | Diaz ................... H01L 29/0657 257/29 |
| 2016/0104705 | A1 | 4/2016 | Chung et al. |
| 2016/0118479 | A1* | 4/2016 | Chang ............... H01L 21/02568 438/156 |
| 2016/0233322 | A1 | 8/2016 | Yeh et al. |
| 2016/0343805 | A1* | 11/2016 | Lee ................... H01L 21/02527 |
| 2017/0011916 | A1 | 1/2017 | Lee et al. |
| 2017/0117367 | A1* | 4/2017 | Engel ............... H01L 29/41725 |
| 2018/0151751 | A1* | 5/2018 | Yeh ................... H01L 29/78696 |
| 2018/0358474 | A1* | 12/2018 | Li ......................... H01L 29/778 |

\* cited by examiner

DEVICE COMPRISING 2D MATERIAL

CROSS-REFERENCE TO RELATED APPLICATION

This application claims the benefit of Korean Patent Application No. 10-2017-0112493, filed on Sep. 4, 2017, in the Korean Intellectual Property Office, the disclosure of which is incorporated herein in its entirety by reference.

BACKGROUND

Inventive concepts relate to a device including a two-dimensional (2D) material, and more particularly, to a vertical transistor device, a fin transistor device, a tunneling device, and a buried transistor device including a 2D material.

Since the success of separation of graphene from graphite, much research into 2D materials including graphene, hexagonal boron nitride (h-BN), and transition metal dichalcogenide (TMDC) has been conducted. The 2D materials may be formed to have only a single atomic layer or several atomic layers. The 2D materials have a small thickness of several nanometers or less and may have better electrical, optical, thermal, and chemical characteristics than existing materials having a 3D crystal structure, and thus the 2D materials have attracted attention as new materials for electronic and optical devices.

SUMMARY

Inventive concepts provide a device including a two-dimensional (2D) material.

According to an aspect of inventive concepts, a device includes a substrate, a first electrode on the substrate, an insulating pattern on the substrate, a second electrode on an upper end of the insulating pattern, a 2D material layer along a side surface of the insulating pattern, a gate insulating layer covering the 2D material layer, and a gate electrode contacting the gate insulating layer. The insulating pattern may extend from the first electrode in a direction substantially vertical to the substrate. The 2D material layer may include at least one atomic layer of a 2D material that is substantially parallel to the side surface of the insulating pattern.

According to another aspect of inventive concepts, a device includes a substrate, a channel structure on the substrate, a first electrode and a second electrode on the substrate, a gate electrode on the substrate, and a gate insulating layer between the channel structure and the gate electrode. The channel structure may extend in a first direction that is parallel to the substrate. The first electrode and a second electrode respectively may be located at both ends of the channel structure. The gate electrode may extend in a second direction that is parallel to the substrate and the gate electrode may intersect the channel structure. The channel structure may include an insulating pattern and a 2D material layer on a surface of the insulating pattern. The 2D material layer may include at least one atomic layer of a 2D material that is parallel to the surface of the insulating pattern.

According to another aspect of inventive concepts, a device includes a substrate, an insulating pattern on the substrate, one pair of 2D material layers on side surfaces of the insulating pattern, a first electrode, and a second electrode. Each of the one pair of 2D material layers may include at least one atomic layer of a 2D material that may be parallel to the side surface of the insulating pattern. The one pair of 2D material layers may include a first 2D material layer and second 2D material layer spaced apart from each other in a first direction that may be parallel to the substrate by interposing the insulating pattern therebetween. The first electrode may contact the first 2D material layer. The second electrode may contact the second 2D material layer.

According to another aspect of inventive concepts, a device includes a substrate including a recess, a 2D material pattern on the substrate, a gate structure contacting the 2D material pattern, a first electrode contacting a first end of the 2D material pattern, and a second electrode contacting a second end of the 2D material pattern. The recess may be recessed from a main surface of the substrate and may extend in a first direction. The 2D material pattern may intersect the recess of the substrate and may extend in a second direction. The gate structure may contact the 2D material pattern and may extend in the first direction along the recess of the substrate. The first electrode may contact a first end of the 2D material pattern. The second electrode may contact a second end of the 2D material pattern. The 2D material pattern may include atomic layers that are parallel to a surface of the substrate.

According to another aspect of inventive concepts, a device includes a substrate including a recess, a 2D material on the substrate, a gate structure intersecting the 2D material pattern, a first electrode contacting a first end of the 2D material pattern, and a second electrode contacting a second end of the 2D material pattern. The recess may be recessed from a main surface of the substrate and may extend in a first direction. The 2D material pattern may extend in the first direction along the recess of the substrate. The gate structure may intersect the 2D material pattern and may extend in a second direction. The first electrode may contact a first end of the 2D material pattern. The second electrode may contact a second end of the 2D material pattern. The 2D material pattern may include a first portion and a second portion. The first portion may be on a lower surface of the recess of the substrate and the second portion may be on a side surface of the recess of the substrate.

According to another aspect of inventive concepts, a device may include a substrate including a fin protruding from a main surface of the substrate and extending in a first direction, a 2D material pattern on the substrate and extending in the first direction along the fin, a gate structure intersecting the 2D material pattern and extending in a second direction, a first electrode contacting a first end of the 2D material pattern, and a second electrode contacting a second end of the 2D material pattern. The 2D material pattern may include a first portion on an upper surface of the fin of the substrate and a second portion on a side surface of the fin of the substrate.

BRIEF DESCRIPTION OF THE DRAWINGS

Embodiments of inventive concepts will be more clearly understood from the following detailed description taken in conjunction with the accompanying drawings in which.

DETAILED DESCRIPTION

When the term "substantially" is used in this specification in connection with a numerical value, it is intended that the associated numerical value include a tolerance of ±10% around the stated numerical value unless the context indicates otherwise.

Figure 1A:
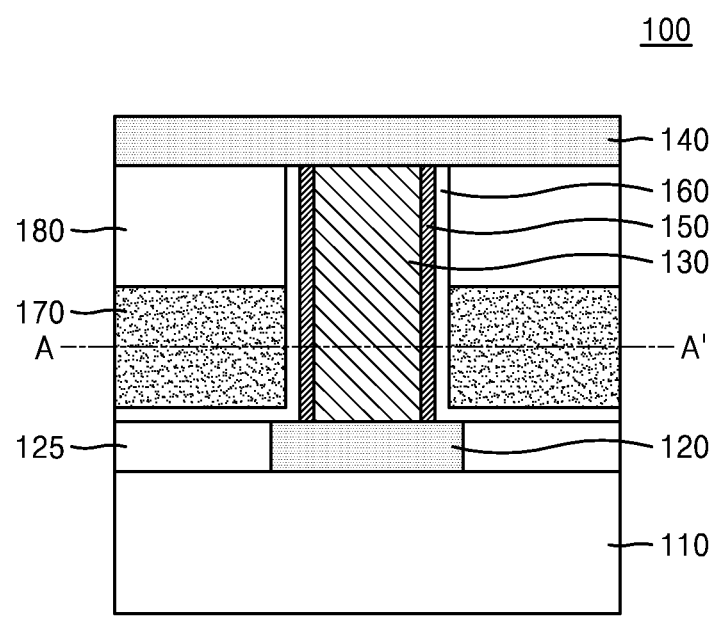
FIGS. 1A and 1B are cross-sectional views of a device including a two-dimensional (2D) material, according to an embodiment of inventive concepts, FIG. 1B being a cross-sectional view taken along line AA' of FIG. 1A.
Figure 1B:
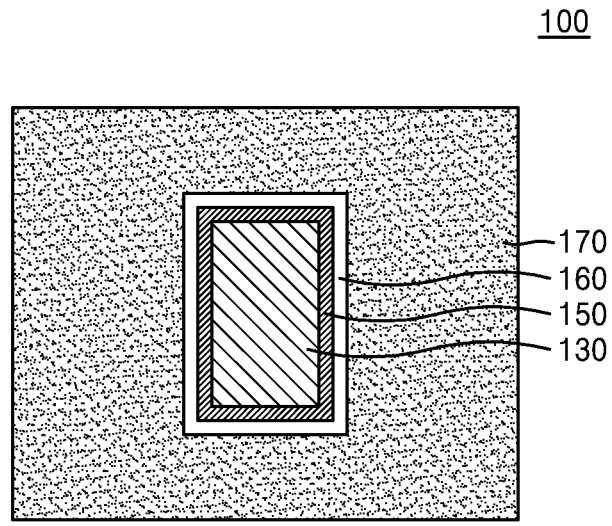

FIGS. 1A and 1B are cross-sectional views of a device 100 including a two-dimensional (2D) material, according to an embodiment of inventive concepts, FIG. 1B being a cross-sectional view taken along line AA' of FIG. 1A.

Referring to FIG. 1A, the device 100 including a 2D material, according to an embodiment of inventive concepts, may include a substrate 110, a first electrode 120, a second electrode 140, an insulating pattern 130, a 2D material layer 150, a gate insulating layer 160, and a gate electrode 170. The device 100 may be a vertical transistor.

The substrate 110 may include a semiconductor material, glass, or plastic. The semiconductor material may include a IV group semiconductor material, a III-V group semiconductor material, or a II-VI group semiconductor material. The IV group semiconductor material may include, for example, silicon (Si), germanium (Ge), or Si—Ge. The III-V group semiconductor material may include, for example, gallium arsenide (GaAs), indium phosphide (InP), GaP, InAs, Indium antimonide (InSb), or InGaAs. The II-VI group semiconductor material may include, for example, zinc telluride (ZnTe) or cadmium sulfide (CdS). The substrate 110 including the semiconductor material may be a bulk wafer or an epitaxial layer.

The first electrode 120 may be located on the substrate 110. The second electrode 140 may be located at an upper end of the insulating pattern 130. The first electrode 120 and the second electrode 140 may independently include a metal, a metal nitride, or a combination thereof. The metal may include, for example, tungsten (W), copper (Cu), gold (Au), silver (Ag), titanium (Ti), tantalum (Ta), ruthenium (Ru), or cobalt (Co). The metal nitride may include, for example, titanium nitride (TiN), TaN, CoN, or WN. According to some embodiments, an area of a cross-section of the first electrode 120 that is parallel to the substrate 110 may differ from an area of a cross-section of the second electrode 140 that is parallel to the substrate 110.

According to some embodiments, a first inter-layer insulating layer 125 may cover a side wall of the first electrode 120. The first electrode 120 may penetrate through the first inter-layer insulating layer 125. The first inter-layer insulating layer 125 may include an insulating material selected from among (or such as), for example, silicon oxide, silicon nitride, and silicon oxynitride.

According to some embodiments, like the first electrode 120, a third inter-layer insulating layer 145 (see FIG. 2A) may be located around the second electrode 140. The second electrode 140 may penetrate through the third inter-layer insulating layer 145 (see FIG. 2A). The third inter-layer insulating layer 145 (see FIG. 2A) may include an insulating material selected from among (or such as), for example, silicon oxide, silicon nitride, and silicon oxynitride.

The insulating pattern 130 may extend from the first electrode 120 to the second electrode 140 in a direction vertical to the substrate 110. Although FIG. 1B shows that a cross-section of the insulating pattern 130 that is parallel to the substrate 110 is rectangular, a shape of the cross-section of the insulating pattern 130 is not limited thereto. The insulating pattern 130 may include an insulating material which may form a 2D material by reacting with another chemical material. According to some embodiments, the insulating pattern 130 may include metal oxides, particularly, transition metal oxides. The insulating pattern 130 may include, for example, tungsten oxides, copper oxides, nickel oxides, molybdenum oxides, titanium oxides, vanadium oxides, zirconium oxides, hafnium oxides, palladium oxides, platinum oxides, niobium oxides, tantalum oxides, technetium oxides, or rhenium oxides. According to some embodiments, the insulating pattern 130 may include a transition metal dioxide selected from among (or such as) molybdenum dioxide ($MoO_2$), tungsten dioxide ($WO_2$), and the like.

The 2D material layer 150 may be located on a side wall of the insulating pattern 130. The 2D material layer 150 may surround the entire side wall of the insulating pattern 130. That is, the 2D material layer 150 may be formed on all of four side surfaces forming the side wall of the insulating pattern 130. The 2D material layer 150 may extend from the first electrode 120 to the second electrode 140 in a direction substantially vertical to the substrate 110 along the side wall of the insulating pattern 130. The 2D material layer 150 may include a 2D material selected from among (or such as) graphene, hexagonal boron nitride (h-BN), transition metal dichalcogenide (TMDC), and the like. The TMDC has a chemical formula of $MX_2$, where M denotes a transition metal selected from among (or such as) molybdenum (Mo), W, nickel (Ni), Ti, vanadium (V), zirconium (Zr), hafnium (Hf), palladium (Pd), platinum (Pt), niobium (Nb), Ta, technetium (Tc), rhenium (Re), and the like, and X denotes a chalcogen element selected from among sulfur (S), selenium (Se), tellurium (Te), and the like. The 2D material layer 150 may be formed by a reaction between the insulating pattern 130 and a chemical material. According to some embodiments, the 2D material layer 150 and the insulating pattern 130 may include a same transition metal element. For example, the 2D material layer 150 may include molybdenum disulfide ($MoS_2$), and the insulating pattern 130 may include $MoO_2$. In addition, the 2D material layer 150 may be doped in an n or p type.

The 2D material layer 150 may include at least one atomic layer of a 2D material. According to some embodiments, the 2D material layer 150 may include one or tens of atomic layers (e.g., in a range of 1 to 90, 1 to 30, 1 to 10, and/or 1-3 atomic layers). When the 2D material layer 150 has a plurality of atomic layers, the plurality of atomic layers may be parallel to each other. Each atomic layer forming the 2D material layer 150 may be parallel to the side wall of the insulating pattern 130. The side wall of the insulating pattern 130 may be substantially vertical to the substrate 110, and the atomic layer of a 2D material may be substantially vertical to the substrate 110.

The 2D material layer 150 may be a semiconductor. Band-gap energy of the 2D material layer 150 may vary according to the number of atomic layers forming the 2D material layer 150. An increase in the number of atomic layers forming the 2D material layer 150 may cause a decrease in the band-gap energy of the 2D material layer 150. That is, an increase in a thickness of the 2D material layer 150 may cause a decrease in the band-gap energy of the 2D material layer 150. Band-gap energy of a material forming the insulating pattern 130 may be greater than the band-gap energy of the 2D material layer 150. For example, band-gap energy of $MoO_2$ forming the insulating pattern 130 may be about 3.9 eV or higher, and the band-gap energy of the 2D material layer 150 including one atomic layer of $MoS_2$ may be about 2.1 eV or lower that is lower than the band-gap energy of $MoO_2$ forming the insulating pattern 130. As the number of atomic layers forming the 2D material layer 150 increase, the band-gap energy of the 2D material layer 150 may further decrease.

The gate insulating layer 160 may cover the 2D material layer 150. As shown in FIG. 1B, the gate insulating layer 160 may surround the circumference of the 2D material layer 150. The gate insulating layer 160 may be in contact with the first electrode 120 and the second electrode 140. The gate insulating layer 160 may include an insulating material selected from among (or such as), for example, $HfO_2$, $ZrO_2$, lanthanum oxide ($LaO_3$), $Ta_2O_5$, $TiO_2$, yttrium oxide ($Y_2O_3$), and aluminum oxide ($Al_2O_3$).

The gate electrode 170 may be located around the gate insulating layer 160. The gate electrode 170 may be in contact with the gate insulating layer 160. According to one embodiment of inventive concepts, the gate electrode 170 may be an all-around gate type. That is, the gate electrode 170 may surround the circumference of the gate insulating layer 160. The gate electrode 170 may include a metal selected from among (or such as), for example, Ti, Ta, Al, W, Ru, Ni, Mo, Hf, Ni, Co, Pt, and Pd or a nitride of the metal.

According to some embodiments, the gate electrode 170 may be spaced apart from the second electrode 140 by a second inter-layer insulating layer 180. The second inter-layer insulating layer 180 may include an insulating material selected from among (or such as), for example, silicon oxide, silicon nitride, and silicon oxynitride.

According to some embodiments, a fourth inter-layer insulating layer (not shown) may be further included under the gate electrode 170. That is, the fourth inter-layer insulating layer (not shown) may be further included between a lower surface of the gate electrode 170 and the gate insulating layer 160. Like the second inter-layer insulating layer 180, the fourth inter-layer insulating layer (not shown) may include an insulating material selected from among (or such as) silicon oxide, silicon nitride, silicon oxynitride, and the like.

Figure 2A:
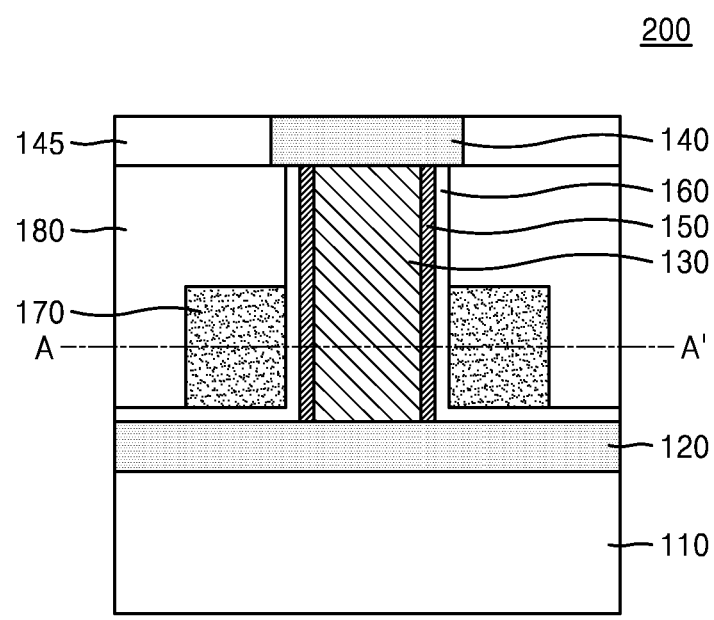
FIGS. 2A and 2B are cross-sectional views of a device including a 2D material, according to an embodiment of inventive concepts, FIG. 2B being a cross-sectional view taken along line AA' of FIG. 2A.
Figure 2B:
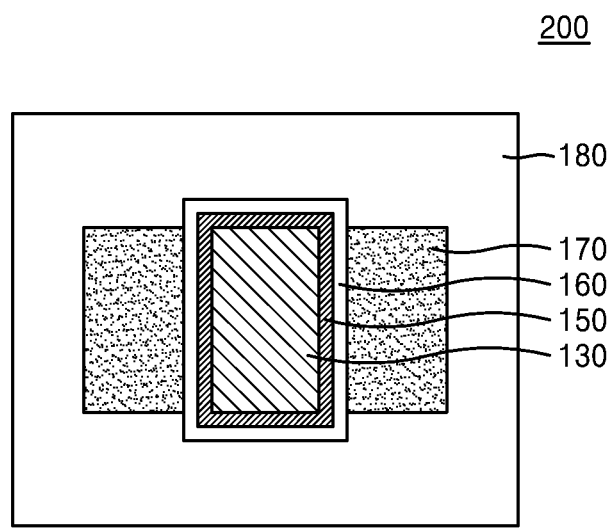

FIGS. 2A and 2B are cross-sectional views of a device 200 including a 2D material, according to an embodiment of inventive concepts, FIG. 2B being a cross-sectional view taken along line AA' of FIG. 2A. Hereinafter, differences from the embodiment described with reference to FIGS. 1A and 1B will be described.

Referring to FIGS. 2A and 2B, the gate electrode 170 included in the device 200 including a 2D material, according to an embodiment of inventive concepts, may be a dual gate type. That is, the gate electrode 170 may include a first gate electrode in contact with one side of the gate insulating layer 160 and a second gate electrode in contact with the other side of the gate insulating layer 160. The first gate electrode and the second gate electrode may be spaced from each other by interposing the insulating pattern 130, the 2D material layer 150, and the gate insulating layer 160.

Figure 3A:
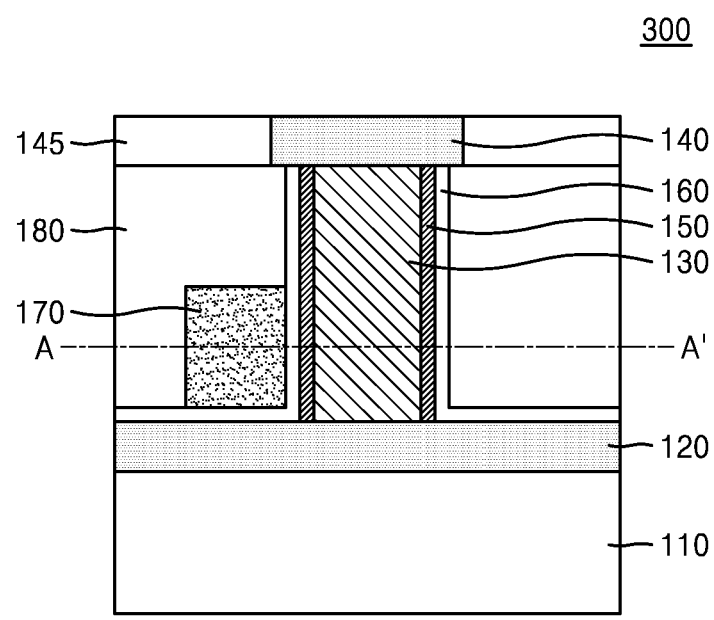
FIGS. 3A and 3B are cross-sectional views of a device including a 2D material, according to an embodiment of inventive concepts, FIG. 3B being a cross-sectional view taken along line AA' of FIG. 3A.
Figure 3B:
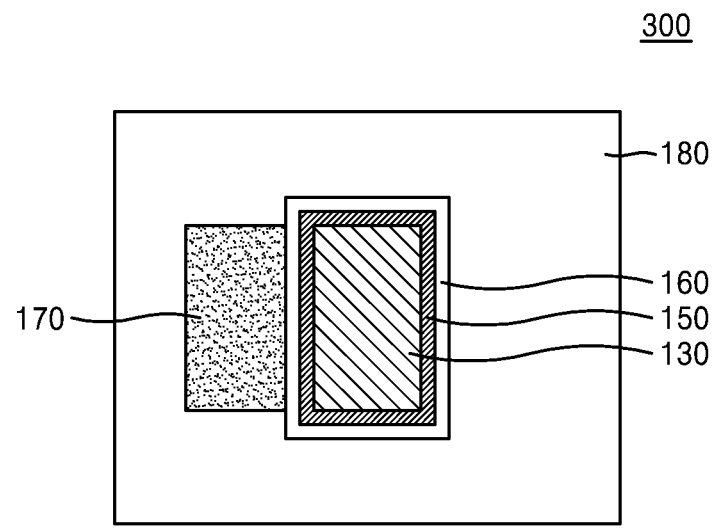

FIGS. 3A and 3B are cross-sectional views of a device 300 including a 2D material, according to an embodiment of inventive concepts, FIG. 3B being a cross-sectional view taken along line AA' of FIG. 3A. Hereinafter, differences from the embodiment described with reference to FIGS. 1A and 1B will be described.

Referring to FIGS. 3A and 3B, the gate electrode 170 included in the device 300 including a 2D material, according to an embodiment of inventive concepts, may be a single gate type. That is, the gate electrode 170 may be located at one side of the gate insulating layer 160.

Figure 4A:
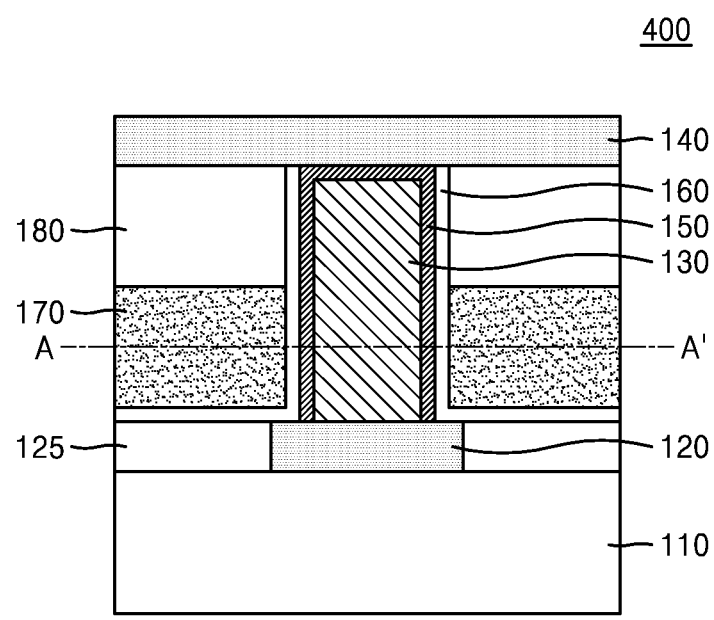
FIGS. 4A and 4B are cross-sectional views of a device including a 2D material, according to an embodiment of inventive concepts, FIG. 4B being a cross-sectional view taken along line AA' of FIG. 4A.
Figure 4B:
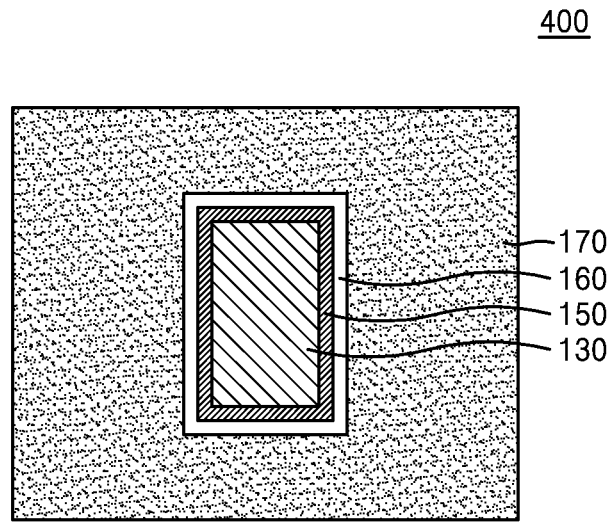

FIGS. 4A and 4B are cross-sectional views of a device 400 including a 2D material, according to an embodiment of inventive concepts, FIG. 4B being a cross-sectional view taken along line AA' of FIG. 4A. Hereinafter, differences from the embodiment described with reference to FIGS. 1A and 1B will be described.

Referring to FIGS. 4A and 4B, the 2D material layer 150 may be located on not only the side wall of the insulating pattern 130 but also an upper surface thereof. That is, the 2D material layer 150 may be located between the second electrode 140 and the insulating pattern 130. According to some embodiments, a portion of the 2D material layer 150 that is located on the upper surface of the insulating pattern 130 may be thinner than a portion of the 2D material layer 150 that is located on the side wall of the insulating pattern 130.

Figure 5A:
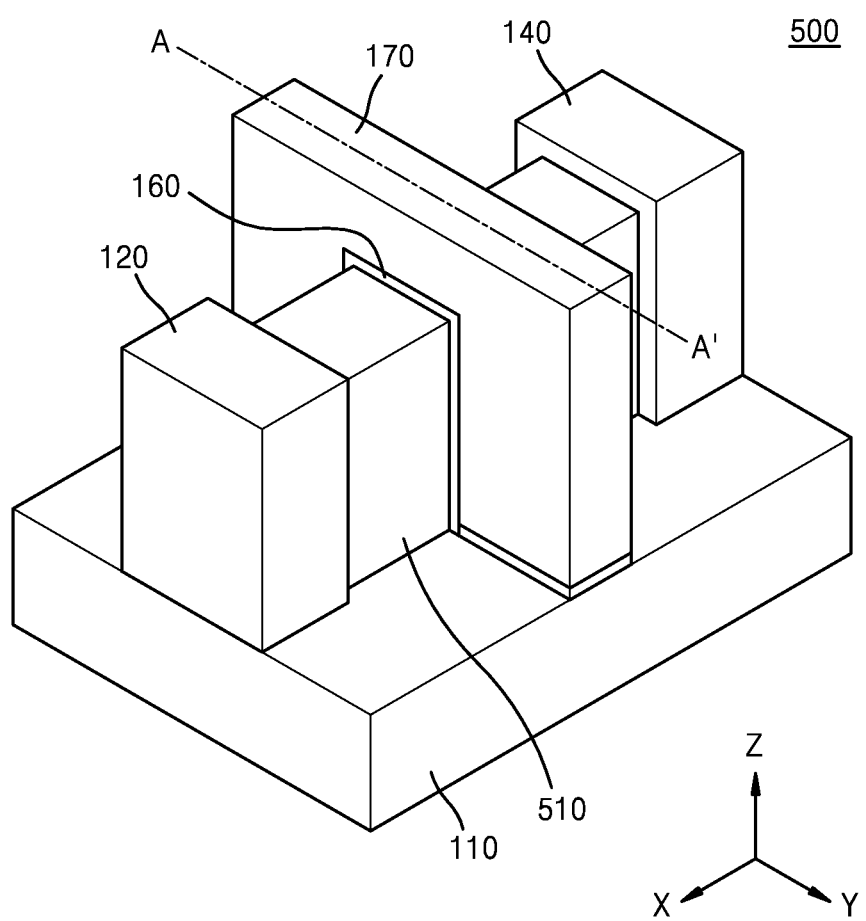
FIG. 5A is a perspective view of a device including a 2D material, according to an embodiment of inventive concepts.
Figure 5B:
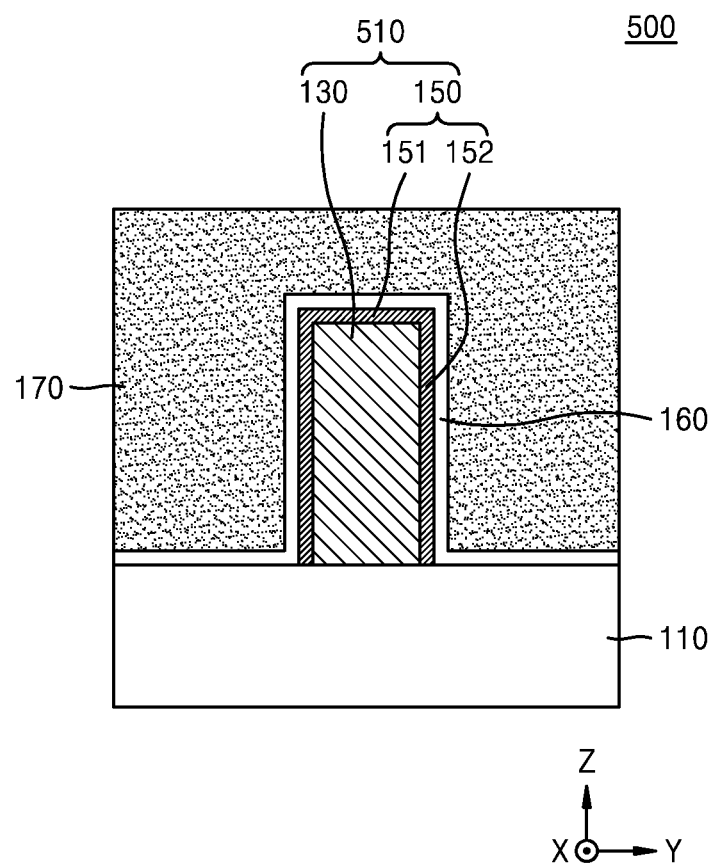
FIG. 5B is a cross-sectional view taken along line AA' of FIG. 5A.

FIG. 5A is a perspective view of a device 500 including a 2D material, according to an embodiment of inventive concepts. FIG. 5B is a cross-sectional view taken along line AA' of FIG. 5A.

The device 500 including a 2D material, according to an embodiment of inventive concepts, may include a channel structure 510, the first electrode 120, the second electrode 140, the gate electrode 170, and the gate insulating layer 160. The device 500 may be a fin transistor.

The channel structure 510 may extend in a first direction X that is parallel to the substrate 110. The channel structure 510 may include the insulating pattern 130 and the 2D material layer 150. The insulating pattern 130 may extend in the first direction X that is parallel to the substrate 110. The 2D material layer 150 may be located on a surface of the insulating pattern 130. The 2D material layer 150 may include, for example, a first portion 151 on the upper surface of the insulating pattern 130 and a second portion 152 on a side surface of the insulating pattern 130. The atomic layer forming the 2D material layer 150 may be parallel to the surface of the insulating pattern 130. For example, the atomic layer may be parallel to the upper surface of the insulating pattern 130, inside the first portion 151 of the 2D material layer 150. The upper surface of the insulating pattern 130 may be substantially parallel to the substrate 110, and in this case, the atomic layer may be substantially parallel to the substrate 110, inside the first portion 151 of the 2D material layer 150. In addition, the atomic layer may be parallel to the side wall of the insulating pattern 130, inside the second portion 152 of the 2D material layer 150. The side wall of the insulating pattern 130 may be substantially vertical to the substrate 110, and in this case, the atomic layer may be substantially vertical to the substrate 110, inside the second portion 152 of the 2D material layer 150.

The first electrode 120 and the second electrode 140 may be respectively located on both ends of the channel structure 510. The first electrode 120 and the second electrode 140 may be electrically connected to the 2D material layer 150 of the channel structure 510.

The gate electrode 170 may pass above the channel structure 510. The gate electrode 170 may extend in a second direction Y that is parallel to the substrate 110 and intersect with the channel structure 510. The gate insulating layer 160 may be located between the channel structure 510 and the gate electrode 170. The gate insulating layer 160 may be in contact with side surfaces and an upper surface of the channel structure 510.

A description of respective constituent materials of the substrate 110, the insulating pattern 130, the 2D material layer 150, the first electrode 120, the second electrode 140, the gate electrode 170, and the gate insulating layer 160 is the same as described with reference to FIGS. 1A and 1B.

Figure 6A:
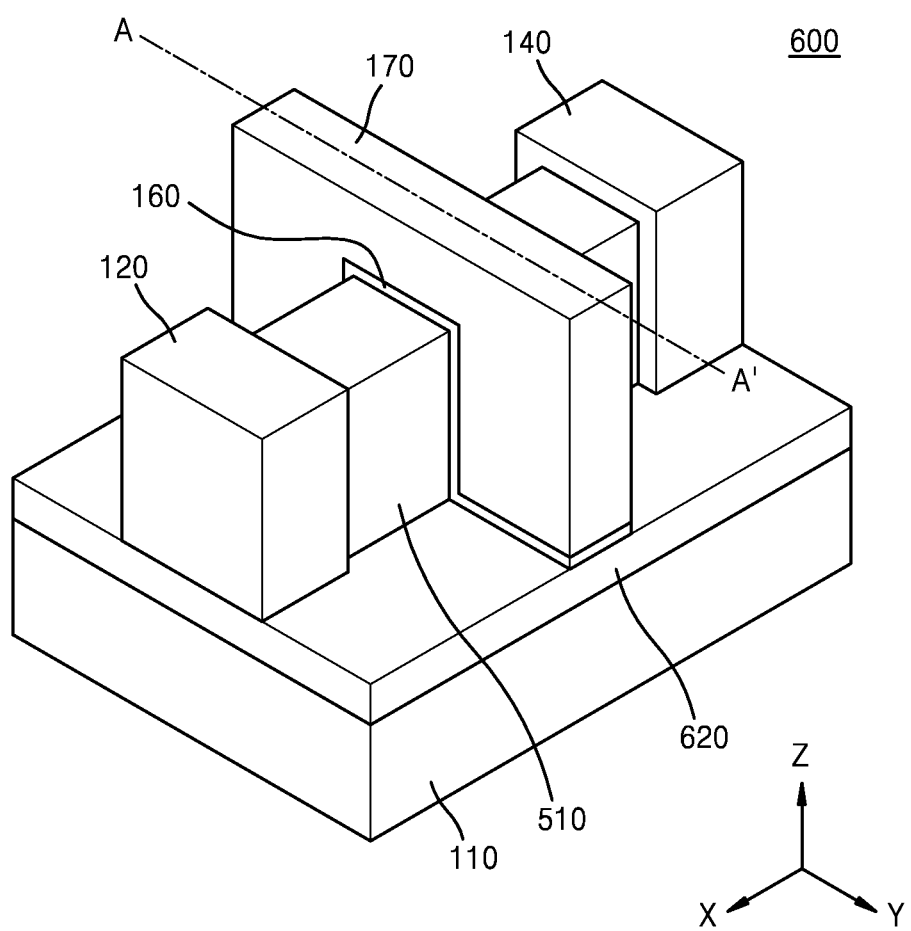
FIG. 6A is a perspective view of a device including a 2D material, according to an embodiment of inventive concepts.
Figure 6B:
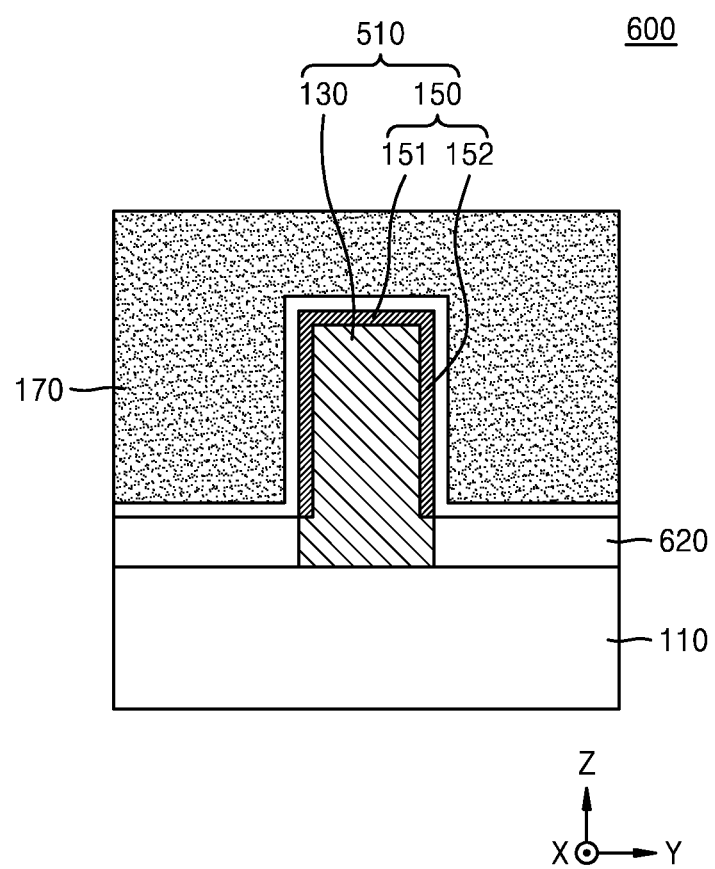
FIG. 6B is a cross-sectional view taken along line AA' of FIG. 6A.

FIG. 6A is a perspective view of a device 600 including a 2D material, according to an embodiment of inventive concepts. FIG. 6B is a cross-sectional view taken along line AA' of FIG. 6A. Hereinafter, differences from the embodiment described with reference to FIGS. 5A and 5B will be described.

Referring to FIGS. 6A and 6B, the device 600 including a 2D material, according to an embodiment of inventive concepts, may further include a device isolation film 620. The device isolation film 620 may include an insulating material selected from among (or such as) silicon oxide, silicon nitride, silicon oxynitride, and the like.

An upper surface of the device isolation film 620 may be lower than the upper surface of the insulating pattern 130. That is, the insulating pattern 130 may protrude from the device isolation film 620. The device isolation film 620 may cover a portion of the side wall of the insulating pattern 130. The device isolation film 620 may not cover the other portion of the side wall of the insulating pattern 130 and the upper surface of the insulating pattern 130. The 2D material layer 150 may be located on the portion of the side wall of the insulating pattern 130, which is not covered by the device isolation film 620, and the upper surface of the insulating pattern 130.

Figure 7A:
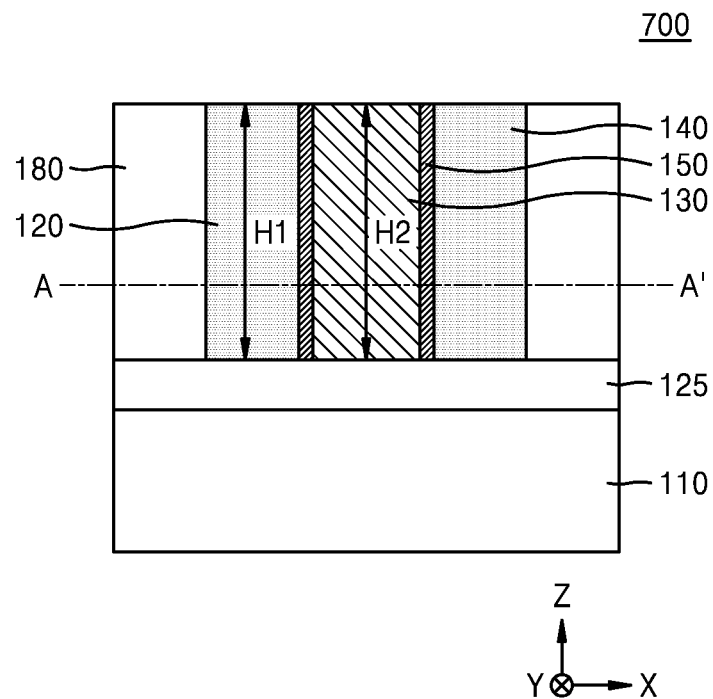
FIGS. 7A and 7B are cross-sectional views of a device including a 2D material, according to an embodiment of inventive concepts, FIG. 7B being a cross-sectional view taken along line AA' of FIG. 7A.
Figure 7B:
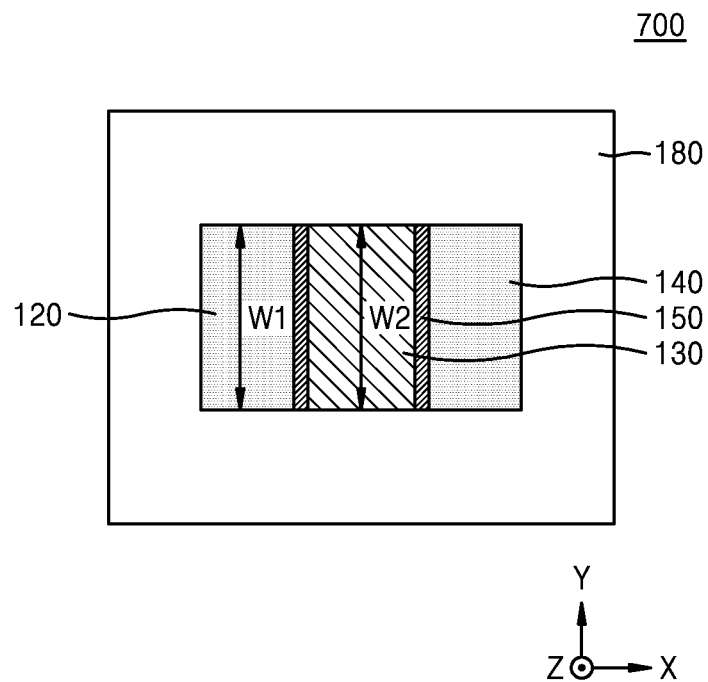

FIGS. 7A and 7B are cross-sectional views of a device 700 including a 2D material, according to an embodiment of inventive concepts, FIG. 7B being a cross-sectional view taken along line AA' of FIG. 7A.

The device 700 including a 2D material, according to an embodiment of inventive concepts, may include the substrate 110, the insulating pattern 130, one pair of 2D material layers 150, the first electrode 120, and the second electrode 140. The device 700 may be a tunneling device.

The insulating pattern 130 is located on the substrate 110. The one pair of 2D material layers 150 are located on the side wall of the insulating pattern 130. The one pair of 2D material layers 150 are spaced apart from each other in the first direction X by the insulating pattern 130. The first electrode 120 is in contact with one of the one pair of 2D material layers 150, and the second electrode 140 is in contact with the other one of the one pair of 2D material layers 150. That is, the first electrode 120 and the second electrode 140 are spaced apart from each other in the first direction X by interposing the insulating pattern 130 and the one pair of 2D material layers 150 therebetween.

A width W1 of the first electrode 120 in the second direction Y may be substantially the same as a width W2 of the insulating pattern 130 in the second direction Y. In addition, a height H1 of first electrode 120 in a third direction Z may be substantially the same as a height H2 of the insulating pattern 130 in the third direction Z.

According to some embodiments, the device 700 may further include the first inter-layer insulating layer 125. The first inter-layer insulating layer 125 may be located on the substrate 110. The first electrode 120, the second electrode 140, and the 2D material layers 150 may be located on the first inter-layer insulating layer 125. As shown in FIG. 7A, the insulating pattern 130 may be located on the first inter-layer insulating layer 125. Unlike FIG. 7A, the insulating pattern 130 may extend from the substrate 110 in a direction substantially vertical to the substrate 110 and penetrate through the first inter-layer insulating layer 125.

According to some embodiments, the device 700 may further include the second inter-layer insulating layer 180. The second inter-layer insulating layer 180 may cover a side wall of the insulating pattern 130, the first electrode 120, and the second electrode 140.

A detailed description of materials forming the substrate 110, the insulating pattern 130, the 2D material layer 150, the first electrode 120, the second electrode 140, the first inter-layer insulating layer 125, and the second inter-layer insulating layer 180 is the same as described with reference to FIGS. 1A and 1B.

Figure 8A:
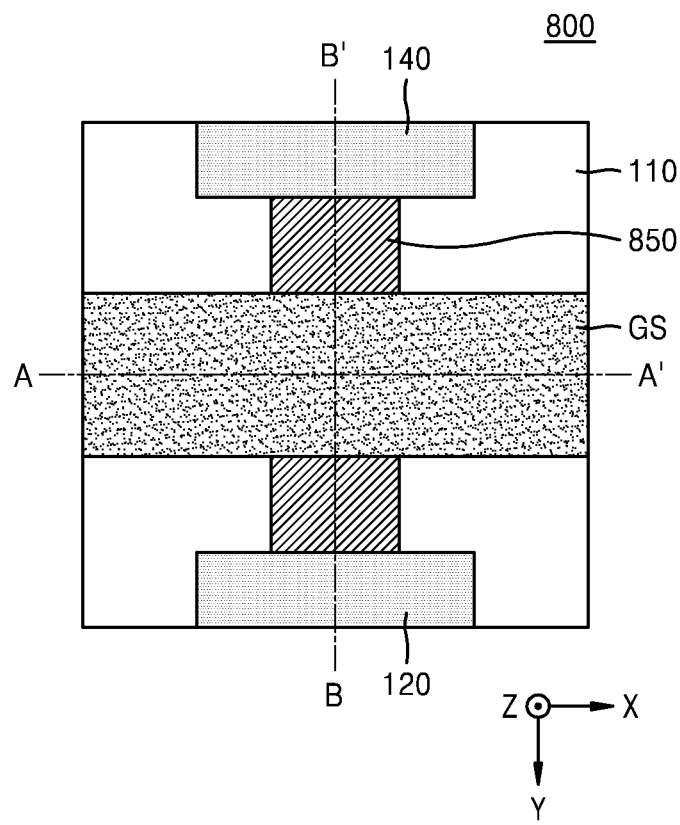
FIG. 8A is a top view of a device including a 2D material, according to an embodiment of inventive concepts.

FIG. 8A is a top view of a device 800 including a 2D material, according to an embodiment of inventive concepts.

Figure 8B:
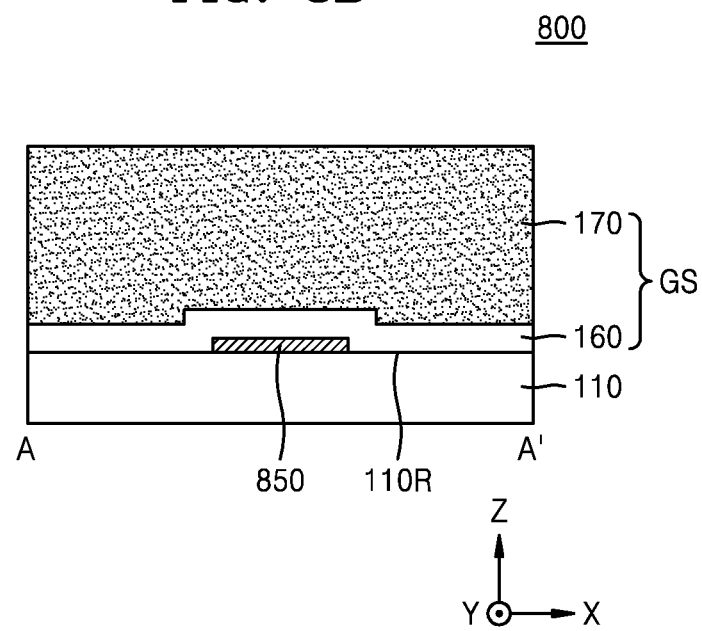
FIG. 8B is a cross-sectional view taken along line AA' of FIG. 8A.
Figure 8C:
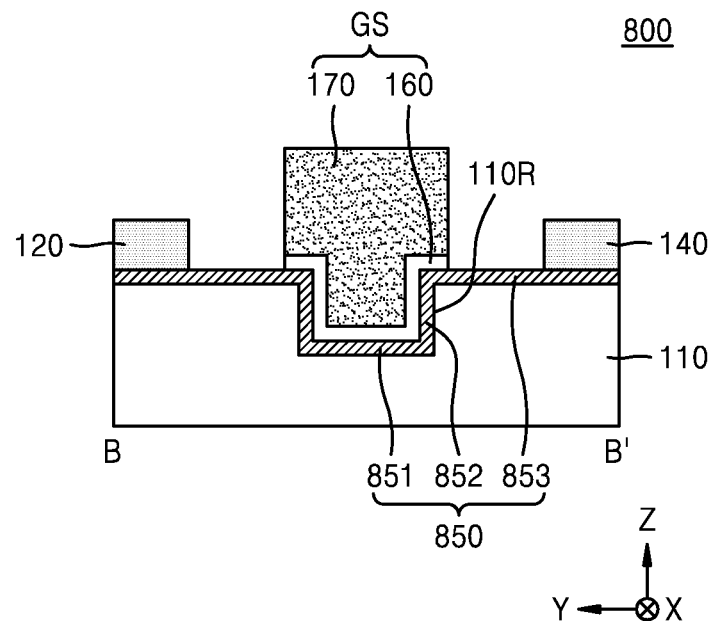
FIG. 8C is a cross-sectional view taken along line BB' of FIG. 8A.

FIG. 8B is a cross-sectional view taken along line AA' of FIG. 8A. FIG. 8C is a cross-sectional view taken along line BB' of FIG. 8A.

Referring to FIGS. 8A, 8B, and 8C, the device 800 including a 2D material, according to an embodiment of inventive concepts, may include the substrate 110, a 2D material pattern 850, a gate structure GS, the first electrode 120, and the second electrode 140. The device 800 may be a buried transistor.

The substrate 110 may have a recess 110R recessed from a main surface of the substrate 110 and extending in the first direction X. The 2D material pattern 850 may extend in the second direction Y. The 2D material pattern 850 may intersect with the recess 110R of the substrate 110. The 2D material pattern 850 may include a 2D material selected from among (or such as) a TMDC and the like. The 2D material pattern 850 may have atomic layers that are parallel to a surface of the substrate 110. For example, the 2D material pattern 850 may include a first portion 851 on a lower surface of the recess 110R of the substrate 110, a second portion 852 on a side surface of the recess 110R of the substrate 110, and a third portion 853 on the main surface of the substrate 110. The atomic layers may be substantially parallel to the lower surface of the recess 110R of the substrate 110, inside the first portion 851 of the 2D material pattern 850. The atomic layers may be substantially parallel to the side surface of the recess 110R of the substrate 110, inside the second portion 852 of the 2D material pattern 850. The atomic layers may be substantially parallel to the main surface of the substrate 110, inside the third portion 853 of the 2D material pattern 850. According to some embodiments, the lower surface of the recess 110R of the substrate 110 may be substantially orthogonal to the side surface of the recess 110R of the substrate 110. In this case, the atomic layers may be substantially vertical to the main surface of the substrate 110, inside the second portion 852 of the 2D material pattern 850.

The gate structure GS may extend in the first direction X along the recess 110R of the substrate 110. The gate structure GS may include the gate insulating layer 160 and the gate electrode 170. The gate structure GS may be in contact with the first portion 851 of the 2D material pattern 850. According to some embodiments, the gate structure GS may be further in contact with the third portion 853 of the 2D material pattern 850. The first electrode 120 may be in contact with one end of the 2D material pattern 850. The second electrode 140 may be in contact with the other end of the 2D material pattern 850.

Figure 9A:
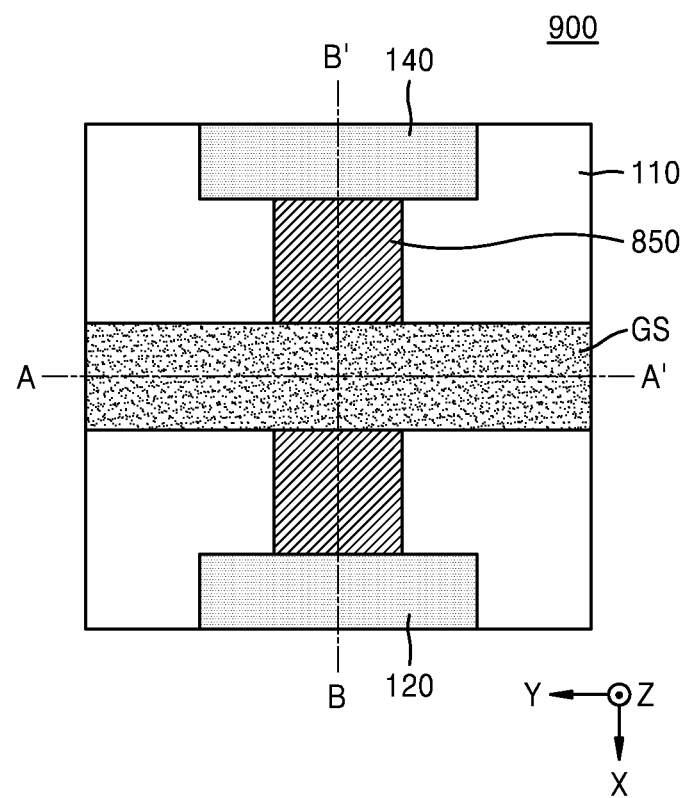
FIG. 9A is a top view of a device including a 2D material, according to an embodiment of inventive concepts.
Figure 9B:
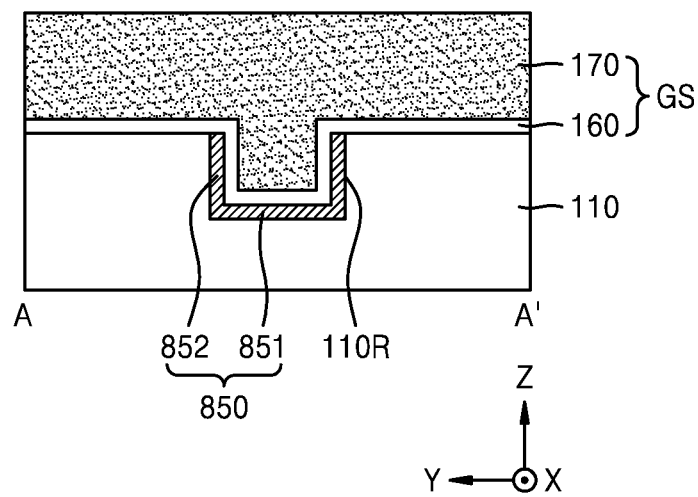
FIG. 9B is a cross-sectional view taken along line AA' of FIG. 9A.
Figure 9C:
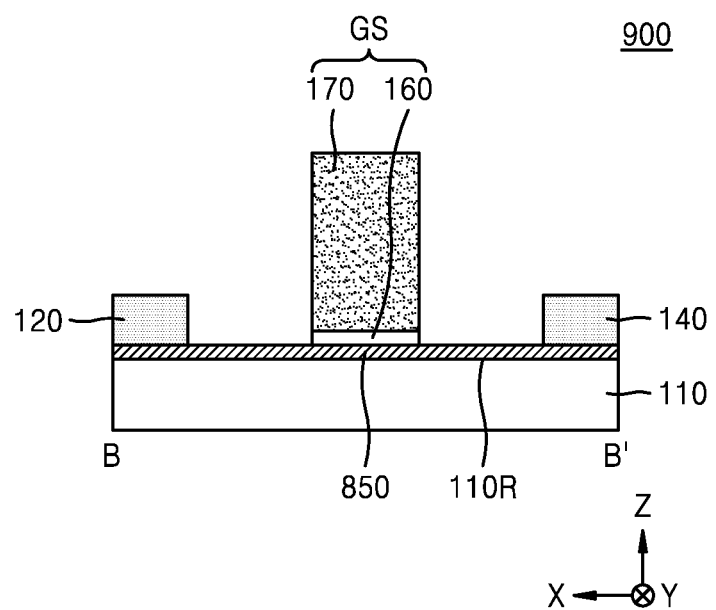
FIG. 9C is a cross-sectional view taken along line BB' of FIG. 9A.

FIG. 9A is a top view of a device 900 including a 2D material, according to an embodiment of inventive concepts. FIG. 9B is a cross-sectional view taken along line AA' of FIG. 9A. FIG. 9C is a cross-sectional view taken along line BB' of FIG. 9A.

The device 900 including a 2D material, according to an embodiment of inventive concepts, may be a buried transistor. Hereinafter, differences between the device 800 including a 2D material, according to the embodiment shown in FIGS. 8A to 8C, and the device 900 including a 2D material, according to the present embodiment, will be described.

Referring to FIGS. 9A to 9C, the 2D material pattern 850 may extend in the first direction X along the recess 110R of the substrate 110. The 2D material pattern 850 may include the first portion 851 on the lower surface of the recess 110R of the substrate 110 and the second portion 852 on the side surface of the recess 110R of the substrate 110. The gate structure GS may intersect with the 2D material pattern 850 and extend in the second direction Y. The gate structure GS may be in contact with the first portion 851 and the second portion 852 of the 2D material pattern 850. In addition, the gate structure GS may be in contact with the main surface of the substrate 110.

Figure 10A:
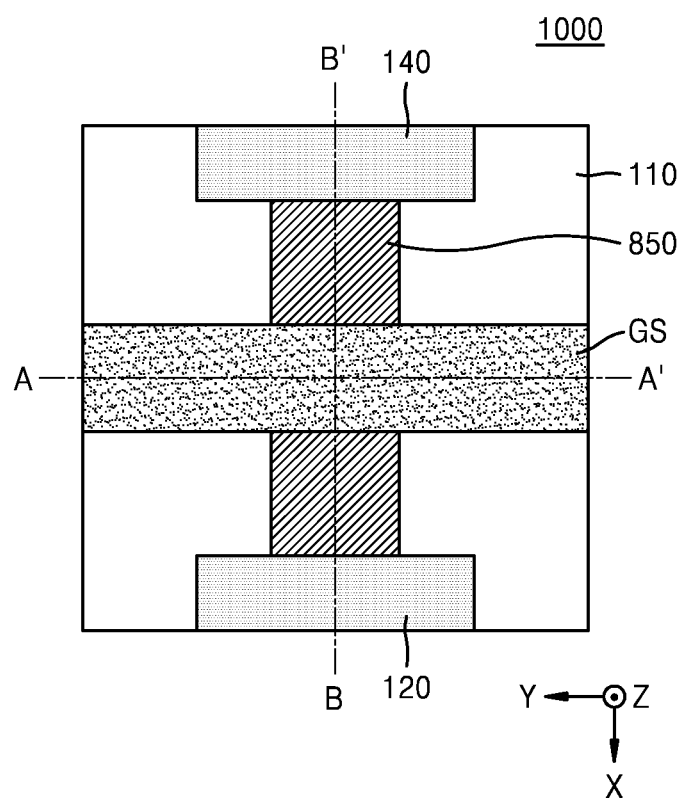
FIG. 10A is a top view of a device including a 2D material, according to an embodiment of inventive concepts.
Figure 10B:
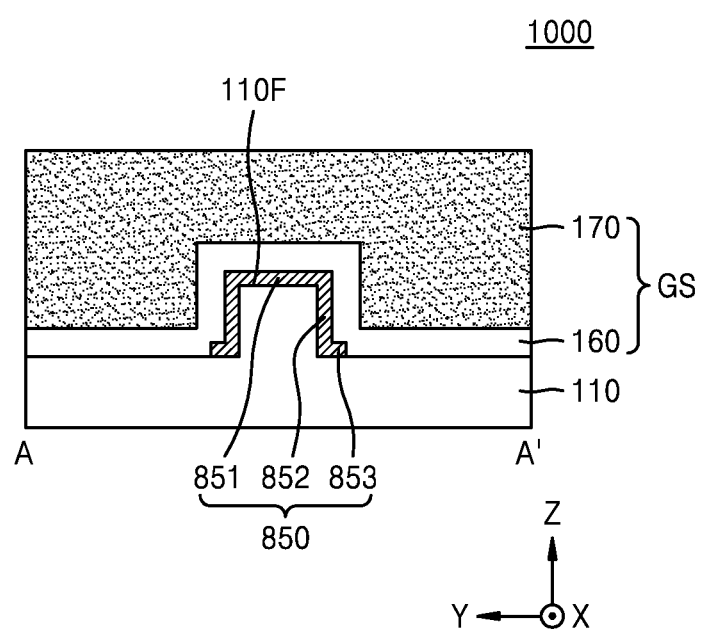
FIG. 10B is a cross-sectional view taken along line AA' of FIG. 10A.
Figure 10C:
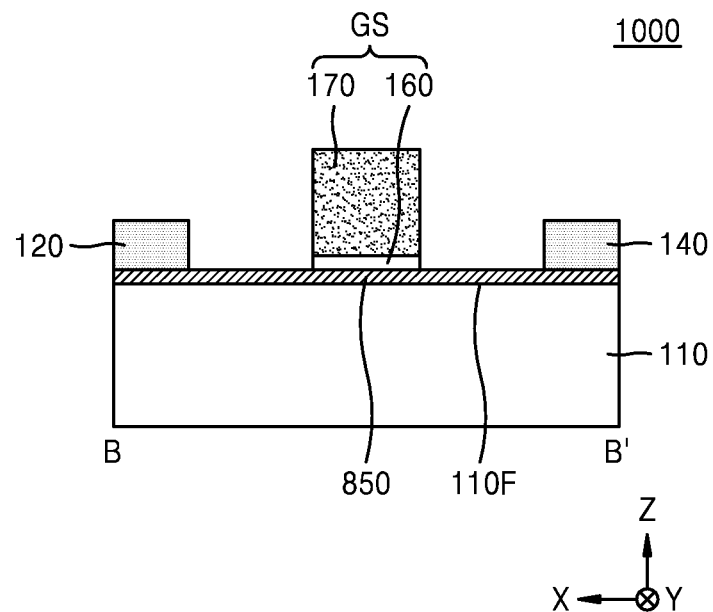
FIG. 10C is a cross-sectional view taken along line BB' of FIG. 10A.

FIG. 10A is a top view of a device 1000 including a 2D material, according to an embodiment of inventive concepts. FIG. 10B is a cross-sectional view taken along line AA' of FIG. 10A. FIG. 10C is a cross-sectional view taken along line BB' of FIG. 10A.

The device 1000 including a 2D material, according to an embodiment of inventive concepts, may be a fin transistor. Hereinafter, differences between the device 900 including a 2D material, according to the embodiment shown in FIGS. 9A to 9C, and the device 1000 including a 2D material, according to the present embodiment, will be described.

The substrate 110 may have a fin 110F protruding from the main surface of the substrate 110 and extending in the first direction X. The 2D material pattern 850 may extend in the first direction X along the fin 110F of the substrate 110. The 2D material pattern 850 may include the first portion 851 on an upper surface of the fin 110F of the substrate 110 and the second portion 852 on a side surface of the fin 110F of the substrate 110. According to some embodiments, the 2D material pattern 850 may further include the third portion 853 on the main surface of the substrate 110. The atomic layers may be substantially parallel to the upper surface of the fin 110F of the substrate 110, inside the first portion 851 of the 2D material pattern 850. The atomic layers may be substantially parallel to the side surface of the fin 110F of the substrate 110, inside the second portion 852 of the 2D material pattern 850. According to some embodiments, the upper surface of the fin 110F of the substrate 110 may be substantially orthogonal to the side surface of the fin 110F of the substrate 110. In this case, the atomic layers may be substantially vertical to the main surface of the substrate 110, inside the second portion 852 of the 2D material pattern 850. The gate structure GS may intersect with the 2D material pattern 850 and extend in the second direction Y. The gate structure GS may be in contact with the first portion 851, the second portion 852, and the third portion 853 of the 2D material pattern 850.

FIGS. 11A to 11H are cross-sectional views for describing a method of manufacturing a device including a 2D material, according to an embodiment of inventive concepts.

Figure 11A:
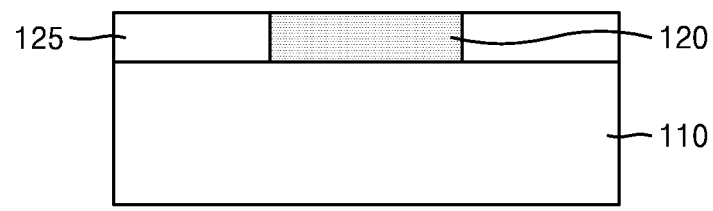
FIGS. 11A to 11H are cross-sectional views for describing a method of manufacturing a device including a 2D material, according to an embodiment of inventive concepts.

Referring to FIG. 11A, the first electrode 120 and the first inter-layer insulating layer 125 are formed on the substrate 110.

Figure 11B:
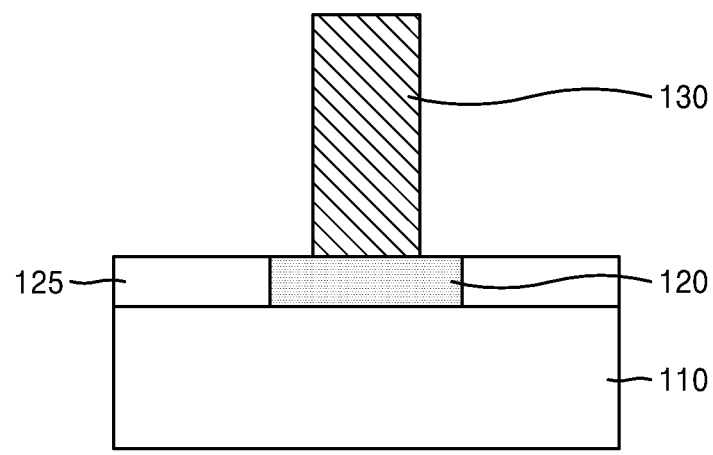

Referring to FIG. 11B, the insulating pattern 130 is formed on the first electrode 120.

Figure 11C:
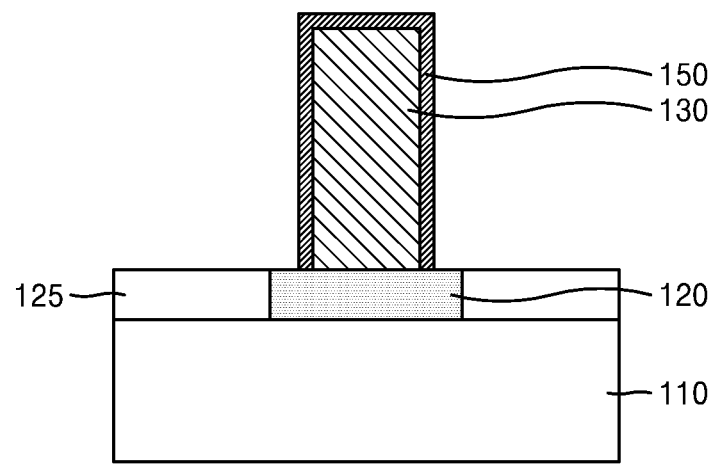

Referring to FIG. 11C, the 2D material layer 150 may be formed on a surface of the insulating pattern 130. The 2D material layer 150 may be formed by a reaction between a chemical material and the surface of the insulating pattern 130. For example, the 2D material layer 150 including a TMDC may be formed by a reaction between a chemical material including a chalcogen element and the surface of the insulating pattern 130 including a transition metal or a transition metal oxide. In detail, the 2D material layer 150 including $MoS_2$ may be formed by a sulfurization reaction between the surface of the insulating pattern 130 including $MoO_2$ and sulfur (S) steam. A process temperature during the sulfurization reaction between $MoO_2$ and sulfur (S) steam may be lower than a sublimation temperature of $MoO_2$. For example, a reaction temperature may be about 400° C. to about 1100° C. Since $MoO_2$ maintains a solid phase at the reaction temperature, the 2D material layer 150 including $MoS_2$ with a uniform thickness may be formed on the surface of the insulating pattern 130. Due to strong Mo—O bonding, the 2D material layer 150 may be formed with a uniform and small thickness. In addition, as a reaction time increases, the number of atomic layers forming the 2D material layer 150 increases, and thus the thickness of the 2D material layer 150 to be formed may be adjusted by adjusting the reaction time. The band-gap energy of the 2D material layer 150 may be adjusted by adjusting the thickness of the 2D material layer 150.

Figure 11D:
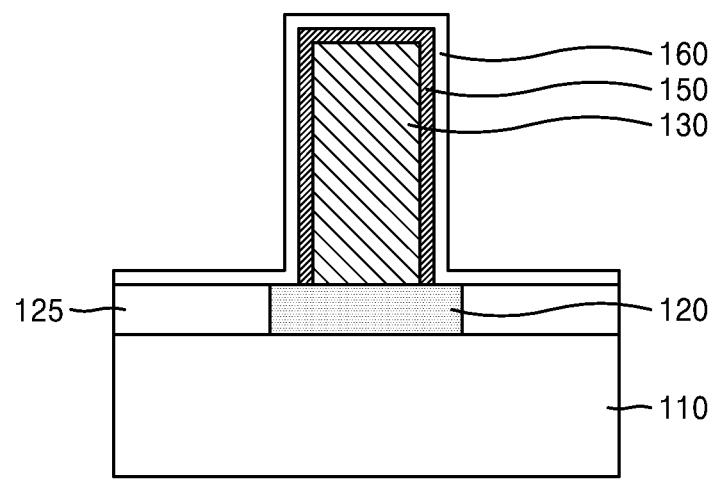

Referring to FIG. 11D, the gate insulating layer 160 covering the 2D material layer 150 is formed. The gate insulating layer 160 may be formed by, for example atomic layer deposition.

Figure 11E:
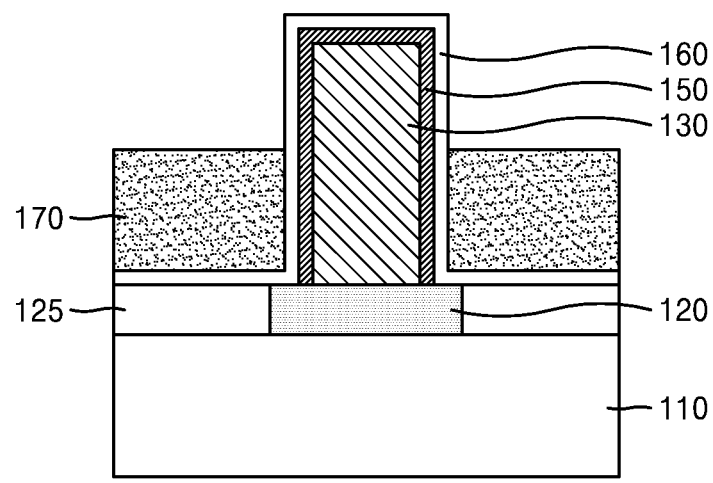

Referring to FIG. 11E, the gate electrode 170 is formed on the gate insulating layer 160. The gate electrode 170 may be formed by, for example, forming a gate layer (not shown) and patterning the gate layer (not shown). According to an embodiment, the gate electrode 170 may be patterned in an all-around type. In the forming the gate layer (not shown), for example, chemical vapor deposition, plasma chemical vapor deposition, or atomic layer deposition may be used. In the patterning the gate layer (not shown), for example, an etch-back process may be used.

Figure 11F:
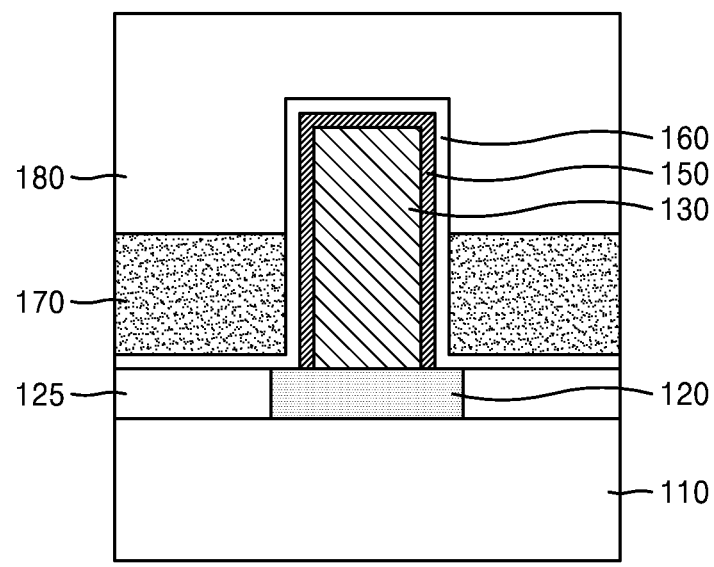

Referring to FIG. 11F, the second inter-layer insulating layer 180 is formed on the gate electrode 170. The second inter-layer insulating layer 180 may be formed by, for example, chemical vapor deposition or plasma chemical vapor deposition.

Figure 11G:
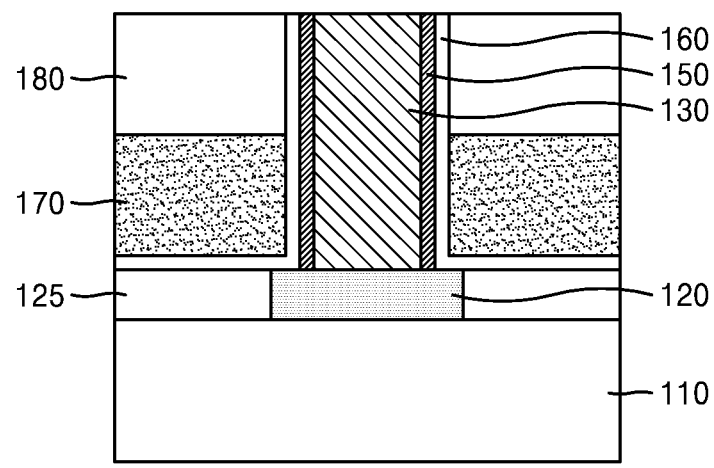

Referring to FIG. 11G, a portion of the second inter-layer insulating layer 180, a portion of the gate insulating layer 160, and a portion of the 2D material layer 150 may be removed such that the upper surface of the insulating pattern 130 is exposed. A portion of the 2D material layer 150, which is formed on the upper surface of the insulating pattern 130, may be removed. In the removal, for example, chemical mechanical polishing (CMP) may be used.

Figure 11H:
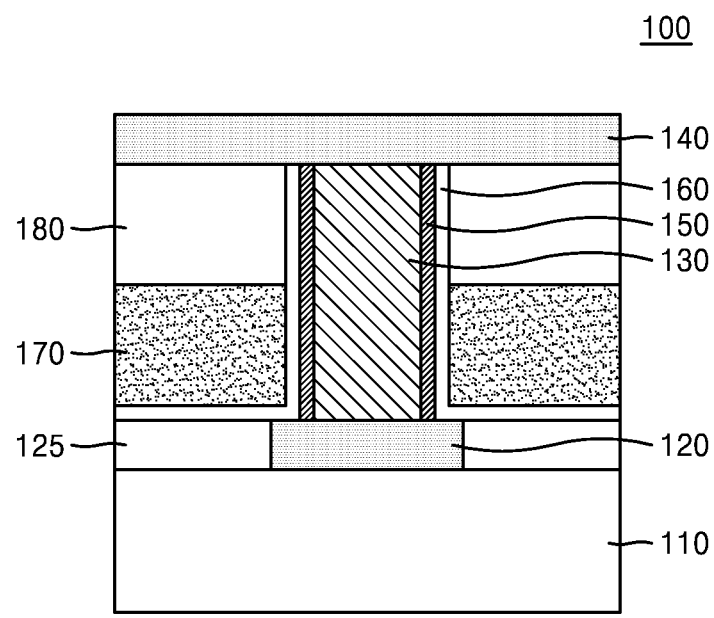

Referring to FIG. 11H, the second electrode 140 is formed on the upper surface of the insulating pattern 130. The second electrode 140 may be formed so as to be electrically connected to the 2D material layer 150.

According to the processes shown in FIGS. 11A to 11H, the device 100 including a 2D material, according to the embodiment of inventive concepts which is shown in FIGS. 1A and 1B, may be manufactured.

When the gate electrode 170 is formed in a dual gate type in the forming the gate electrode 170, which is shown in FIG. 11E, the device 200 including a 2D material, according to the embodiment of inventive concepts which is shown in FIGS. 2A and 2B, may be manufactured.

When the gate electrode 170 is formed in a single gate type in the forming the gate electrode 170, which is shown in FIG. 11F, the device 300 including a 2D material, according to the embodiment of inventive concepts which is shown in FIGS. 3A and 3B, may be manufactured.

When the portion of the 2D material layer 150, which is formed on the upper surface of the insulating pattern 130, is not removed or is partially removed in the operation shown in FIG. 11G, the device 400 including a 2D material, according to the embodiment of inventive concepts which is shown in FIGS. 4A and 4B, may be manufactured.

FIGS. 12A to 12E are cross-sectional views for describing a method of manufacturing a device including a 2D material, according to an embodiment of inventive concepts.

Referring to 12A, the insulating pattern 130 is formed on the substrate 110. A detailed description of the forming the insulating pattern 130 is the same as described with reference to FIG. 11B.

Referring to 12B, the device isolation film 620 is formed on the substrate 110. The device isolation film 620 may be formed with a lower height than a height of the insulating pattern 130 such that a portion of the insulating pattern 130 may be not covered by the device isolation film 620. The device isolation film 620 may be formed by, for example, chemical vapor deposition, plasma chemical vapor deposition, or a thermal oxidation process.

Referring to 12C, the 2D material layer 150 is formed on a surface of the insulating pattern 130. By doing this, the channel structure 510 including the insulating pattern 130 and the 2D material layer 150 is formed. According to some embodiments, the 2D material layer 150 may be formed only on a surface of the insulating pattern 130, which is not covered by the device isolation film 620. For example, as shown in FIG. 12C, the 2D material layer 150 may be formed on an upper surface and a portion of a side wall of the insulating pattern 130. A detailed description of the forming the 2D material layer 150 is the same as described with reference to FIG. 11C.

Referring to 12D, the gate insulating layer 160 is formed on the 2D material layer 150.

Referring to 12E, the gate electrode 170 is formed on the gate insulating layer 160. A detailed description of the forming the gate electrode 170 is the same as described with reference to FIG. 11E. Thereafter, the first electrode 120 (see FIG. 5A) and the second electrode 140 (see FIG. 5A) are respectively formed on both ends of the channel structure 510. According to some embodiments, the first electrode 120 (see FIG. 5A) and the second electrode 140 (see FIG. 5A) may be formed between the forming the 2D material layer 150, which is shown in FIG. 12C, and the forming the gate insulating layer 160, which is shown in FIG. 12D.

According to the processes shown in FIGS. 12A to 12E, the device 600 including a 2D material, according to the embodiment of inventive concepts which is shown in FIGS. 6A and 6B, may be manufactured.

Figure 12A:
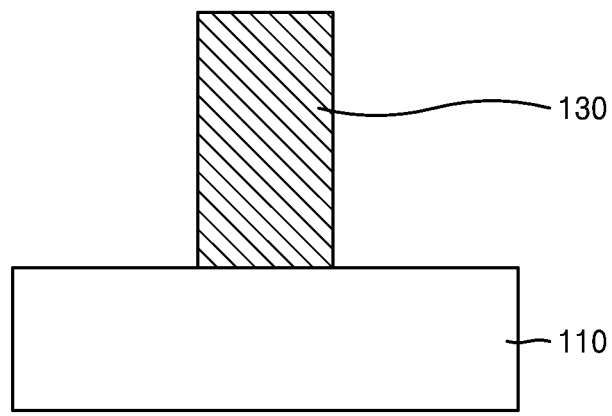
FIGS. 12A to 12E are cross-sectional views for describing a method of manufacturing a device including a 2D material, according to an embodiment of inventive concepts.
Figure 12B:
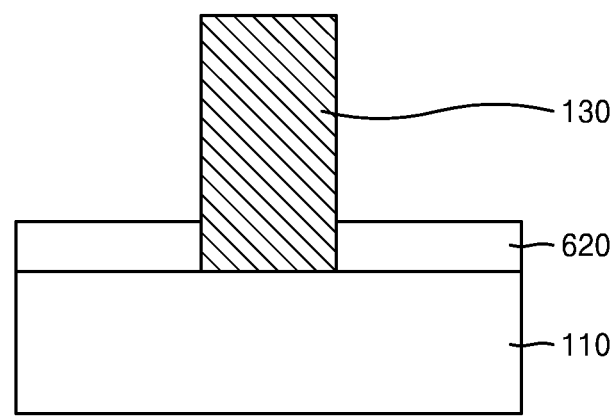
Figure 12C:
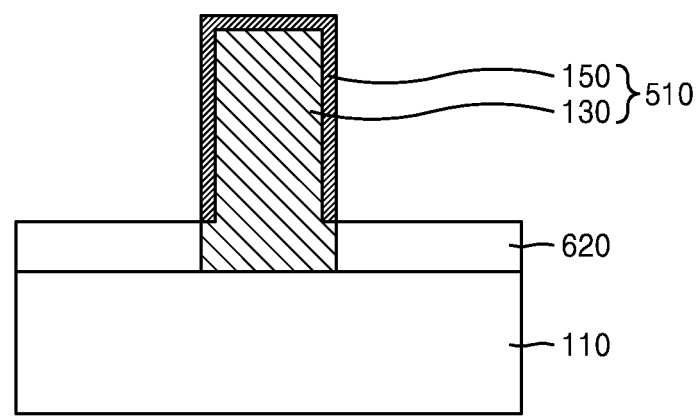
Figure 12D:
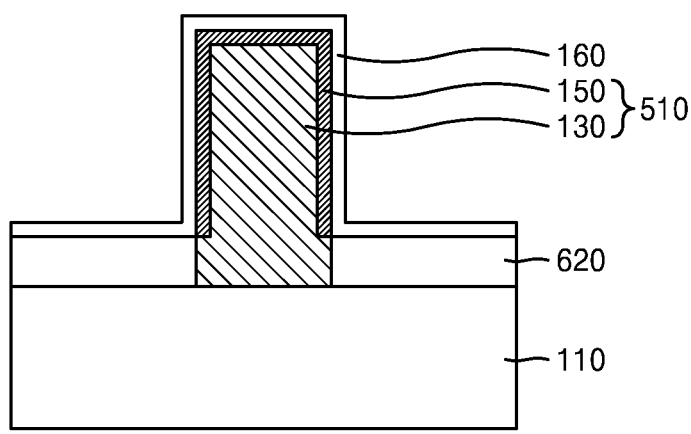
Figure 12E:
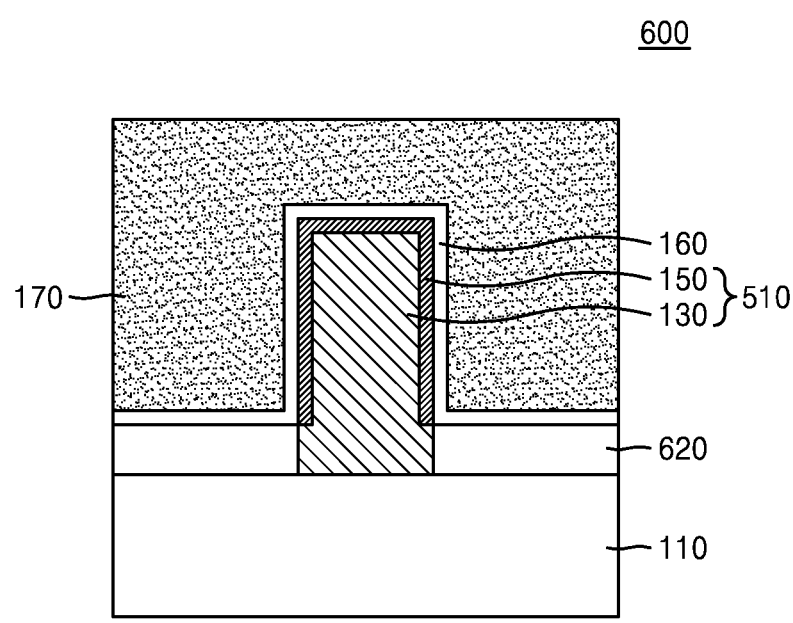

According to some embodiments, unlike FIGS. 12D and 12E, the gate insulating layer 160 and the gate electrode 170 may be formed by a replacement gate method. For example, a sacrificial gate structure (not shown) is first formed, and then an inter-layer insulating layer (not shown) covering a side wall of the sacrificial gate structure (not shown) is formed. Thereafter, the sacrificial gate structure (not shown) is removed, and the gate insulating layer 160 and the gate electrode 170 may be formed in a space from which the sacrificial gate structure (not shown) has been removed.

When the forming the device isolation film 620, which is shown in FIG. 12B, is omitted, the device 500 including a 2D material, according to the embodiment of inventive concepts which is shown in FIGS. 5A and 5B, may be manufactured.

FIGS. 13A to 13F are cross-sectional views for describing a method of manufacturing a device including a 2D material, according to an embodiment of inventive concepts.

Figure 13A:
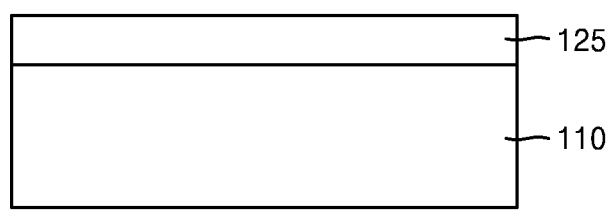
FIGS. 13A to 13F are cross-sectional views for describing a method of manufacturing a device including a 2D material, according to an embodiment of inventive concepts.

Referring to FIG. 13A, the first inter-layer insulating layer 125 is formed on the substrate 110. The first inter-layer insulating layer 125 may be formed by, for example, atomic layer deposition, thermal oxidation, chemical vapor deposition, or plasma chemical vapor deposition.

Figure 13B:
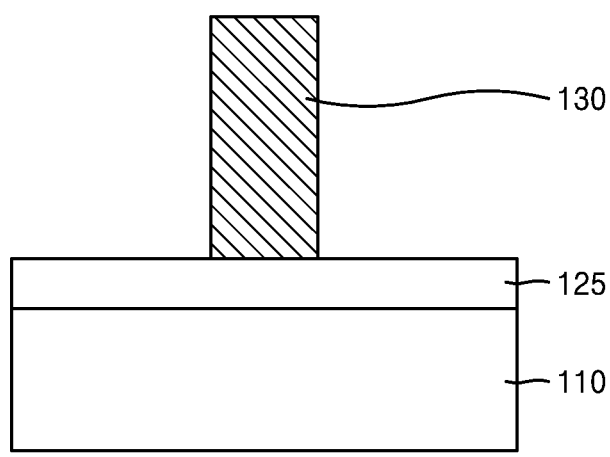

Referring to FIG. 13B, the insulating pattern 130 is formed on the first inter-layer insulating layer 125. A detailed description of the forming the insulating pattern 130 is the same as described with reference to FIG. 11B.

Figure 13C:
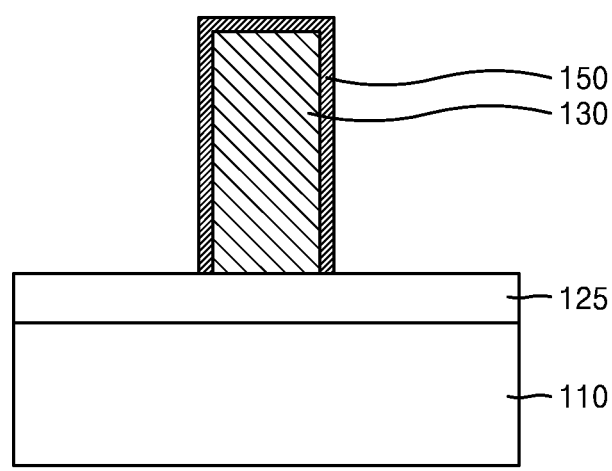
Figure 13D:
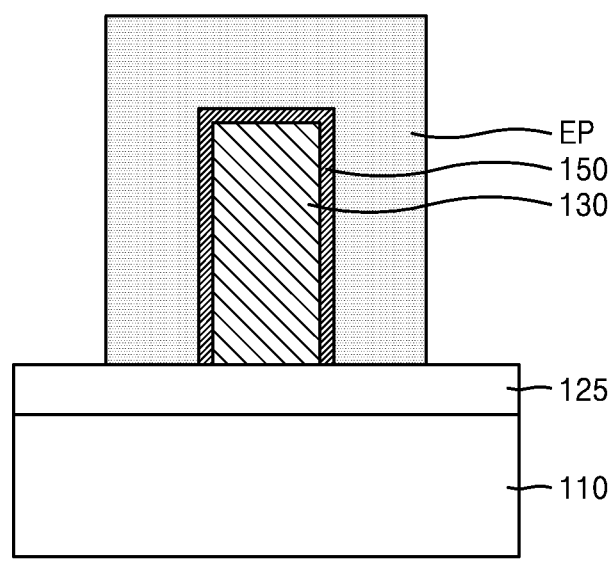
Figure 13E:
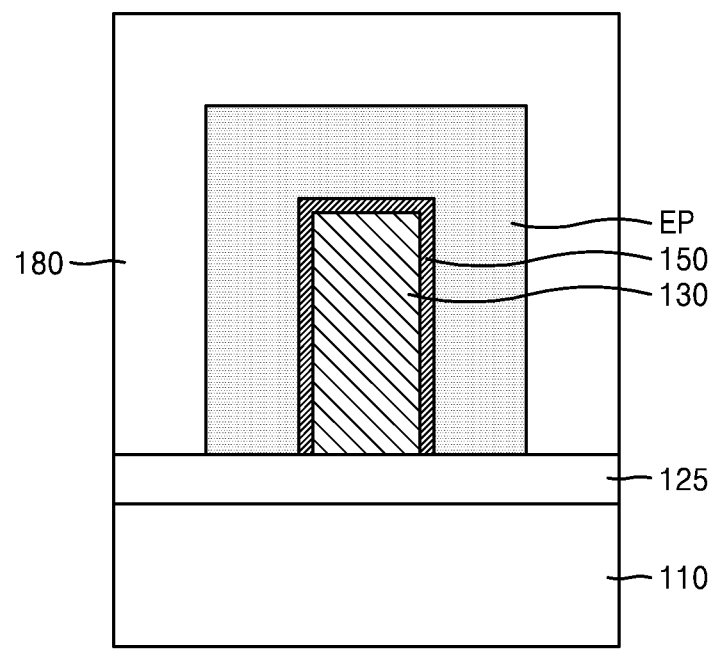
Figure 13F:
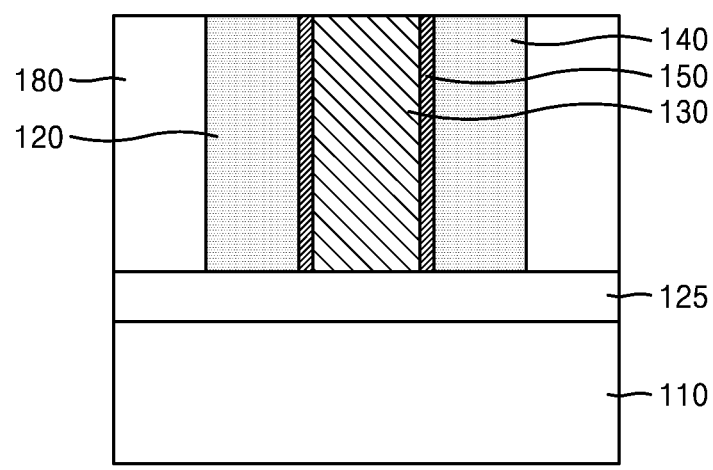

Referring to FIG. 13C, the 2D material layer 150 is formed on a surface of the insulating pattern 130. A detailed description of the forming the 2D material layer 150 is the same as described with reference to FIG. 11C.

Referring to 13D, an electrode pattern EP is formed on the 2D material layer 150.

Referring to 13E, the second inter-layer insulating layer 180 is formed on the electrode pattern EP. The second inter-layer insulating layer 180 may be formed by, for example, chemical vapor deposition or plasma chemical vapor deposition.

Referring to 13F, a portion of the second inter-layer insulating layer 180, the electrode pattern EP, and the 2D material layer 150 is removed such that an upper surface of the insulating pattern 130 is exposed. For example, a polishing process selected from among (or such as) CMP and the like may be used. By removing the portion of the electrode pattern EP, the first electrode 120 and the second electrode 140 may be formed. By removing a portion of the 2D material layer 150, which is formed on the upper surface of the insulating pattern 130, one pair of 2D material layers 150 located on a side wall of the insulating pattern 130 and separated from each other may be formed.

According to the processes shown in FIGS. 13A to 13F, the device 700 including a 2D material, according to the embodiment of inventive concepts which is shown in FIGS. 7A and 7B, may be manufactured.

FIGS. 14A to 14D are cross-sectional views for describing a method of manufacturing a device including a 2D material, according to an embodiment of inventive concepts.

Figure 14A:
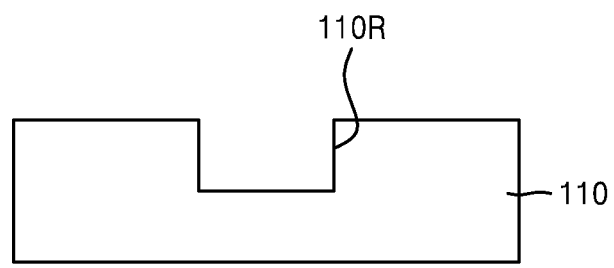
FIGS. 14A to 14D are cross-sectional views for describing a method of manufacturing a device including a 2D material, according to an embodiment of inventive concepts.
Figure 14A:
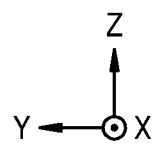

Referring to FIG. 14A, the substrate 110 having the recess 110R extending in the first direction X may be provided.

Figure 14B:
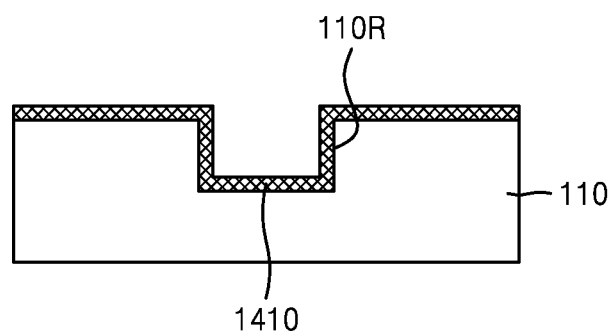
Figure 14B:
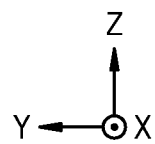

Referring to FIG. 14B, a material pattern 1410 extending in the second direction Y may be formed on the substrate 110. The material pattern 1410 may include a material which may react with a chemical material to thereby form a 2D material. For example, the material pattern 1410 may include a transition metal oxide or a transition metal. The material pattern 1410 may include, for example, $MoO_2$, $MoO_3$, or Mo.

Figure 14C:
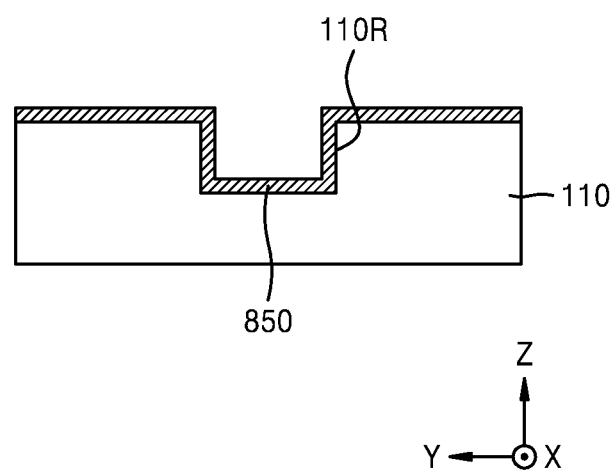

Referring to FIG. 14C, the material pattern 1410 (see FIG. 14B) may be substituted with the 2D material pattern 850. For example, the material pattern 1410 (see FIG. 14B) may react with a reactant including a chalcogen-group element. The reactant may be, for example, sulfur (S) steam.

Figure 14D:
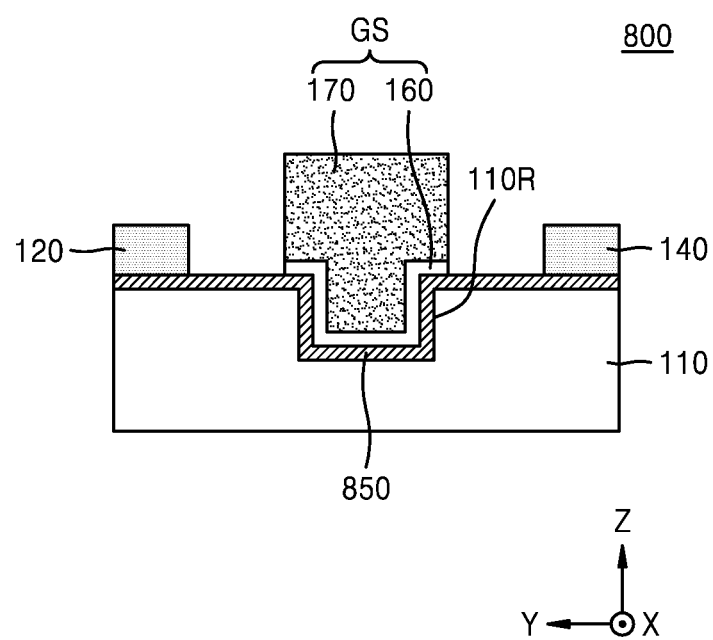

Referring to FIG. 14D, the gate structure GS, the first electrode 120, and the second electrode 140 may be formed on the 2D material pattern 850.

According to the processes shown in FIGS. 14A to 14D, the device 800 including a 2D material, according to the embodiment of inventive concepts which is shown in FIGS. 8A to 8C, may be manufactured.

FIGS. 15A to 15E are cross-sectional views for describing a method of manufacturing a device including a 2D material, according to an embodiment of inventive concepts.

Figure 15A:
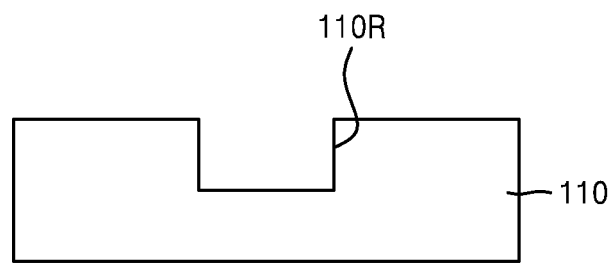
FIGS. 15A to 15E are cross-sectional views for describing a method of manufacturing a device including a 2D material, according to an embodiment of inventive concepts.

Referring to FIG. 15A, the substrate 110 having the recess 110R extending in the first direction X may be provided.

Figure 15B:
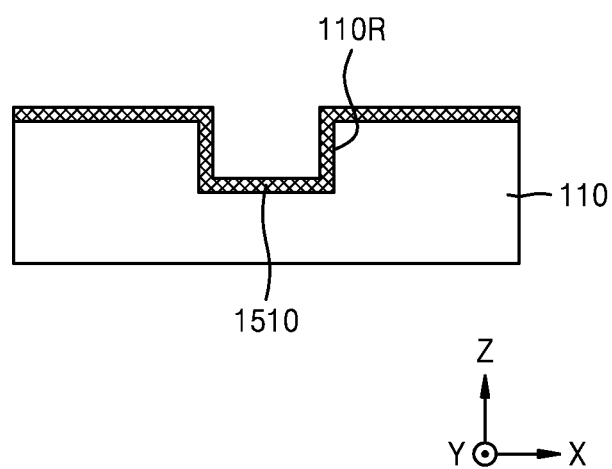

Referring to FIG. 15B, a material layer 1510 may be formed on the substrate 110. The material layer 1510 may include a material which may react with a chemical material to thereby form a 2D material. For example, the material layer 1510 may include a transition metal oxide or a transition metal. The material layer 1510 may include, for example, $MoO_2$, $MoO_3$, or Mo.

Figure 15C:
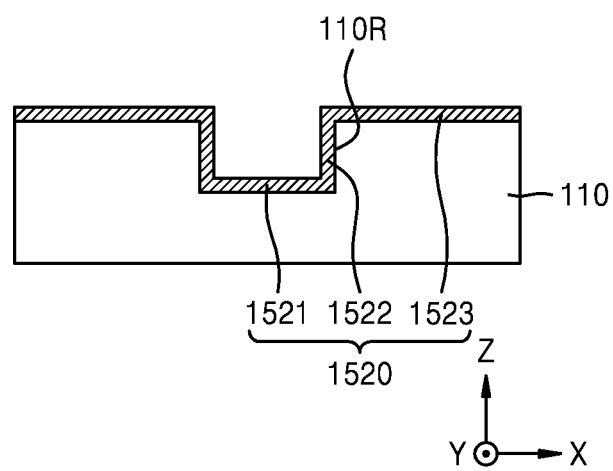

Referring to FIG. 15C, the material layer 1510 may be substituted with a 2D material layer 1520. For example, the material layer 1510 may react with a reactant including a chalcogen-group element. The reactant may be, for example, sulfur (S) steam. The 2D material layer 1520 may include a first portion 1521 on a lower surface of the recess 110R of the substrate 110, a second portion 1522 on a side surface of the recess 110R of the substrate 110, and a third portion 1523 on a main surface of the substrate 110.

Figure 15D:
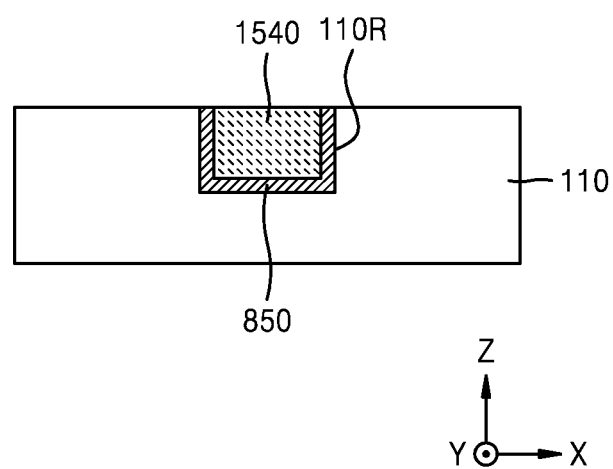

Referring to FIG. 15D, the 2D material pattern 850 may be formed by removing the third portion 1523 of the 2D material layer 1520, which is formed on the main surface of the substrate 110. For example, the removing the third portion 1523 (see FIG. 15C) of the 2D material layer 1520 may include forming a cover layer 1540 on the 2D material layer 1520 and polishing a portion of the cover layer 1540 and the third portion 1523 (see FIG. 15C) of the 2D material layer 1520 such that the main surface of the substrate 110 is exposed.

Figure 15E:
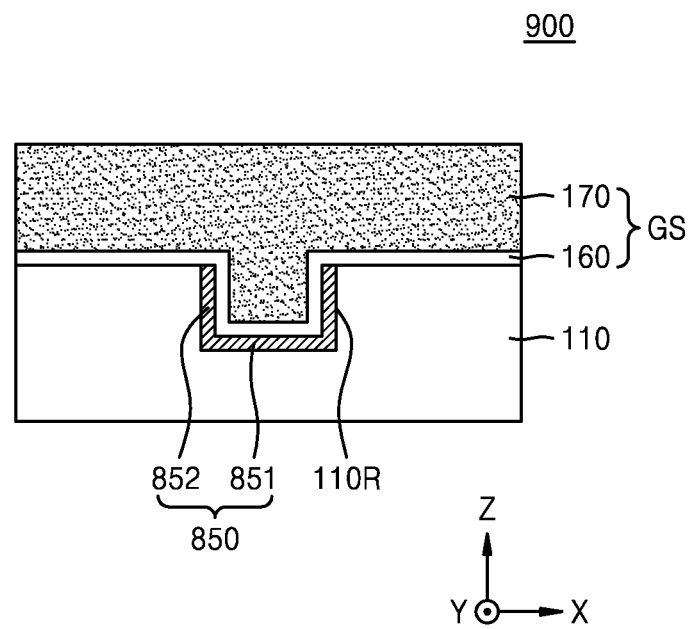

Referring to FIG. 15E, the gate structure GS, the first electrode (see FIGS. 9A and 9C), and the second electrode 140 (see FIGS. 9A and 9C) may be formed on the 2D material pattern 850.

According to the processes shown in FIGS. 15A to 15E, the device 900 including a 2D material, according to the embodiment of inventive concepts which is shown in FIGS. 9A to 9C, may be manufactured.

FIGS. 16A to 16E are cross-sectional views for describing a method of manufacturing a device including a 2D material, according to an embodiment of inventive concepts.

Figure 16A:
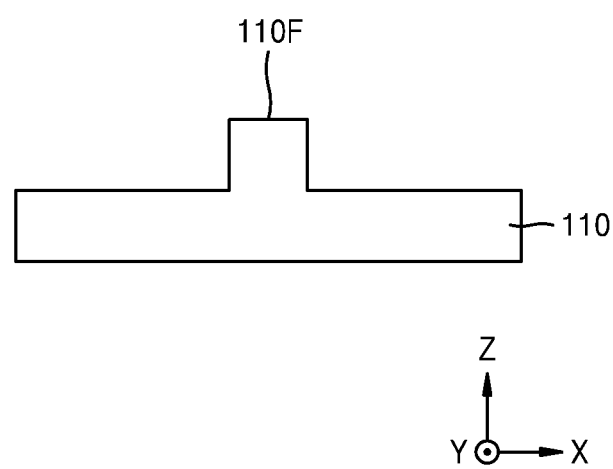
FIGS. 16A to 16E are cross-sectional views for describing a method of manufacturing a device including a 2D material, according to an embodiment of inventive concepts.

Referring to FIG. 16A, the substrate 110 having the fin 110F extending in the first direction X may be provided.

Figure 16B:
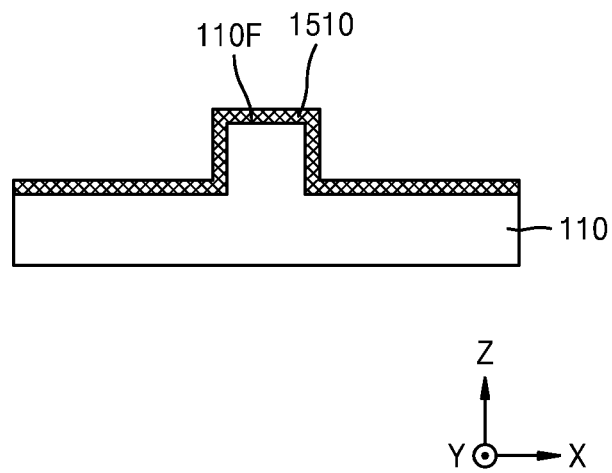

Referring to FIG. 16B, the material layer 1510 may be formed on the substrate 110.

Figure 16C:
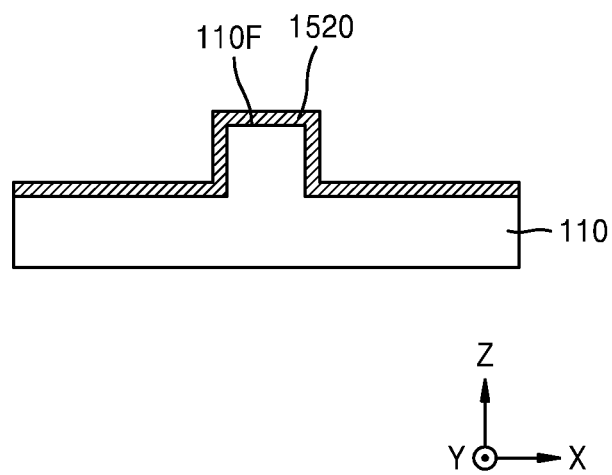

Referring to FIG. 16C, the material layer 1510 may be substituted to the 2D material layer 1520.

Figure 16D:
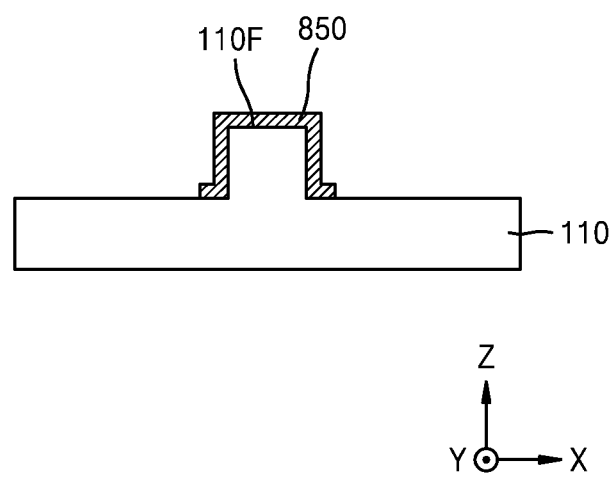

Referring to FIG. 16D, the 2D material pattern 850 may be formed by removing a portion of the 2D material layer 1520.

Figure 16E:
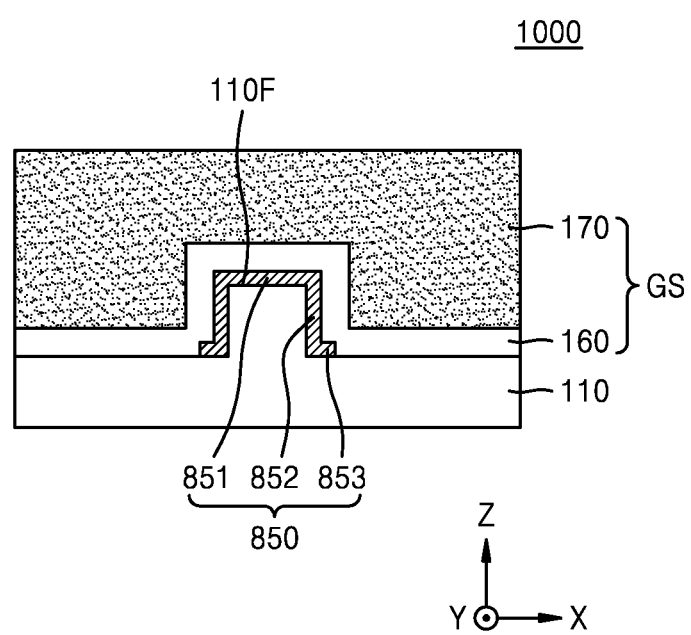

Referring to FIG. 16E, the gate structure GS, the first electrode (see FIGS. 10A and 10C), and the second electrode 140 (see FIGS. 10A and 10C) may be formed on the 2D material pattern 850.

According to the processes shown in FIGS. 16A to 16E, the device 1000 including a 2D material, according to the embodiment of inventive concepts which is shown in FIGS. 10A to 10C, may be manufactured.

The embodiments disclosed in inventive concepts should be considered in descriptive sense only and not for purposes of limitation, and the scope of the technical idea of inventive concepts is not limited by the embodiments. The protection scope of inventive concepts should be analysed by the following claims, and it should be analysed that all technical ideas within the scope equivalent to the protection scope are included in the right scope of inventive concepts.

What is claimed is:
1. A device comprising:
a substrate;
a first electrode on the substrate;
an insulating pattern on the substrate, the insulating pattern extending from the first electrode in a direction substantially vertical to the substrate;
a second electrode on an upper end of the insulating pattern;
a 2D material layer along a side surface of the insulating pattern, the 2D material layer including at least one atomic layer of a 2D material that is substantially parallel to the side surface of the insulating pattern, a transition metal element in the insulating pattern being the same as a transition metal element in the 2D material layer, the transition metal element being molybdenum (Mo) or tungsten (W);

a gate insulating layer covering the 2D material layer; and a gate electrode contacting the gate insulating layer.

2. The device of claim 1, wherein the 2D material layer includes a transition metal dichalcogenide.

3. The device of claim 1, wherein the insulating pattern includes a transition metal dioxide.

4. The device of claim 1, wherein
the insulating pattern includes molybdenum dioxide, and
the 2D material includes a molybdenum chalcogenide.

5. The device of claim 1, wherein
the side surface of the insulating pattern is substantially vertical to the substrate, and
the at least one atomic layer of the 2D material is substantially vertical to the substrate.

6. The device of claim 1, wherein the gate insulating layer contacts the first electrode and the second electrode.

7. The device of claim 1, wherein the 2D material layer extends from the first electrode to the second electrode in the direction substantially vertical to the substrate along the side surface of the insulating pattern.

8. The device of claim 1, wherein the at least one atomic layer of the 2D material layer is substantially vertical to the substrate.

9. The device of claim 1, wherein a cross-sectional area of the first electrode in a direction parallel to the substrate differs from a cross-sectional area of the second electrode in the direction parallel to the substrate.

10. The device of claim 1, wherein the 2D material layer further includes a portion between the insulating pattern and the second electrode.

11. The device of claim 1, wherein the gate electrode is an all-around gate electrode surrounding a circumference of the gate insulating layer.

12. The device of claim 1, wherein the insulating pattern extends from a top surface of the first electrode in a direction substantially vertical to the substrate such that a bottom surface of the insulating pattern is on the top surface of the first electrode.

13. A device comprising:
a substrate;
a channel structure on the substrate,
    the channel structure extending in a first direction that is parallel to the substrate,
    the channel structure including an insulating pattern and a 2D material layer on a surface of the insulating pattern,
    the 2D material layer including at least one atomic layer of a 2D material that is parallel to the surface of the insulating pattern, and
    a transition metal element in the insulating pattern being the same as a transition metal element in the 2D material layer, the transition metal element being molybdenum (Mo) or tungsten (W);
a first electrode and a second electrode on the substrate, the first electrode and the second electrode respectively being located at both ends of the channel structure;

a gate electrode on the substrate, the gate electrode extending in a second direction that is parallel to the substrate, and the gate electrode intersecting the channel structure; and
a gate insulating layer between the channel structure and the gate electrode.

14. The device of claim 13, wherein the gate insulating layer contacts a side surface of the channel structure and an upper surface of the channel structure.

15. The device of claim 13, wherein
the 2D material layer includes a first portion and a second portion,
the first portion of the 2D material layer is on an upper surface of the insulating pattern, and
the second portion of the 2D material layer is on a side surface of the insulating pattern.

16. The device of claim 15, wherein
inside the first portion of the 2D material layer, each of the at least one atomic layer is substantially parallel to the substrate, and inside the second portion of the 2D material layer, the at least one atomic layer is substantially vertical to the substrate.

17. The device of claim 13, further comprising:
a device isolation film on the substrate, wherein
an upper surface of the insulating pattern and a portion of a side surface of the insulating pattern are not covered by the device isolation film, and
the 2D material layer is on the portion of the side surface of the insulating pattern that is not covered by the device isolation film, and
the 2D material layer is on the upper surface of the insulating pattern.

18. A device comprising:
a substrate;
an insulating pattern on the substrate;
one pair of 2D material layers on side surfaces of the insulating pattern,
    each of the one pair of 2D material layers including at least one atomic layer of a 2D material that is parallel to the side surfaces of the insulating pattern, and
    the one pair of 2D material layers including a first 2D material layer and a second 2D material layer spaced apart from each other in a first direction that is parallel to the substrate by interposing the insulating pattern therebetween;
a first electrode contacting the first 2D material layer and being spaced apart from the second 2D material layer; and
a second electrode contacting the second 2D material layer and being spaced apart from the first 2D material layer.

19. The device of claim 18, wherein
a width of the first electrode in a second direction that is parallel to the substrate is substantially the same as a width of the insulating pattern in the second direction, and
the second direction crosses the first direction.

20. The device of claim 18, wherein a height of the first electrode in a third direction that is vertical to the substrate is substantially the same as a height of the insulating pattern in the third direction.

* * * * *